(12) United States Patent
Miyakawa et al.

(10) Patent No.: US 9,208,848 B2
(45) Date of Patent: Dec. 8, 2015

(54) SEMICONDUCTOR STORAGE DEVICE

(71) Applicant: KABUSHIKI KAISHA TOSHIBA, Minato-ku, Tokyo (JP)

(72) Inventors: Tadashi Miyakawa, Yokohama Kanagawa (JP); Katsuhiko Hoya, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/475,126

(22) Filed: Sep. 2, 2014

(65) Prior Publication Data

US 2015/0262638 A1 Sep. 17, 2015

Related U.S. Application Data

(60) Provisional application No. 61/951,935, filed on Mar. 12, 2014.

(51) Int. Cl.
G11C 11/16 (2006.01)
G11C 29/00 (2006.01)

(52) U.S. Cl.
CPC ............ G11C 11/1659 (2013.01); G11C 29/72 (2013.01); G11C 29/74 (2013.01)

(58) Field of Classification Search
CPC ....................................................... G11C 11/16
USPC ........................................................... 365/158
See application file for complete search history.

(56) References Cited

U.S. PATENT DOCUMENTS

| | | | |
|---|---|---|---|
| 5,539,698 A | 7/1996 | Suzuki | |
| 6,058,053 A | 5/2000 | Tsuji et al. | |
| 8,254,192 B2 * | 8/2012 | Tsuchida | 365/200 |
| 2002/0057605 A1 | 5/2002 | Yamakoshi | |
| 2003/0235071 A1 | 12/2003 | Okazawa | |
| 2004/0057309 A1 * | 3/2004 | Kato et al. | 365/202 |
| 2004/0184331 A1 | 9/2004 | Hanzawa et al. | |
| 2005/0157572 A1 * | 7/2005 | Yamada | 365/200 |
| 2008/0308887 A1 | 12/2008 | Asao et al. | |
| 2012/0043630 A1 | 2/2012 | Omori et al. | |
| 2012/0155146 A1 | 6/2012 | Ueda et al. | |
| 2012/0193601 A1 | 8/2012 | Tsukamoto | |
| 2012/0286339 A1 | 11/2012 | Asao | |

FOREIGN PATENT DOCUMENTS

| | | |
|---|---|---|
| JP | 09231789 A | 9/1997 |
| JP | 2010093277 A | 4/2010 |

OTHER PUBLICATIONS

Related U.S. Appl. No. 14/201,642; First Named Inventor: Tadashi Miyakawa; Title: "Semiconductor Storage Device", filed Mar. 7, 2014.

* cited by examiner

*Primary Examiner* — Son Mai
(74) *Attorney, Agent, or Firm* — Holtz, Holtz, Goodman & Chick PC

(57) ABSTRACT

According to one embodiment, a semiconductor storage device includes a first storage area including a plurality of memory cells each including a resistance change element which stores data; a second storage area including a plurality of memory cells each including a resistance change element which stores data; a sub memory cell array including the first storage area and the second storage area: a memory cell array including a plurality of sub memory cell arrays arranged along a column direction and a row direction; a third storage area which stores redundancy information and to supply the redundancy information to the sub memory cell array; and a control circuit which controls an access operation to the memory cell array.

16 Claims, 21 Drawing Sheets

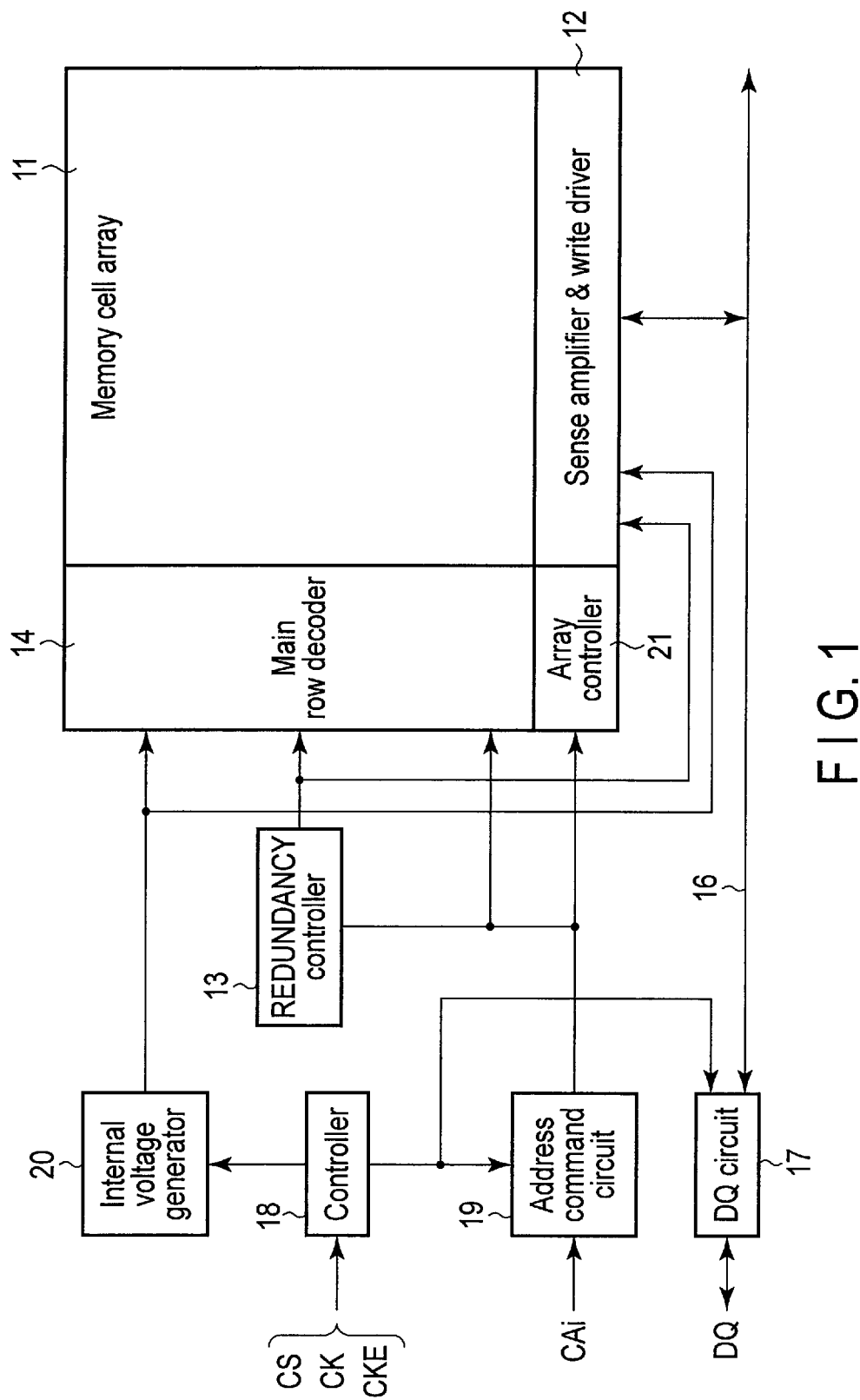
F I G. 1

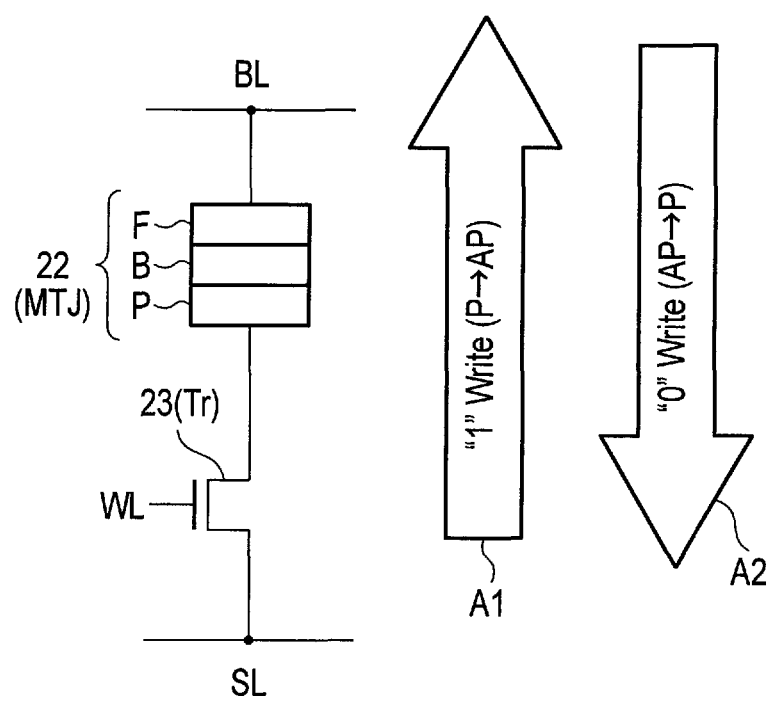
F I G. 3

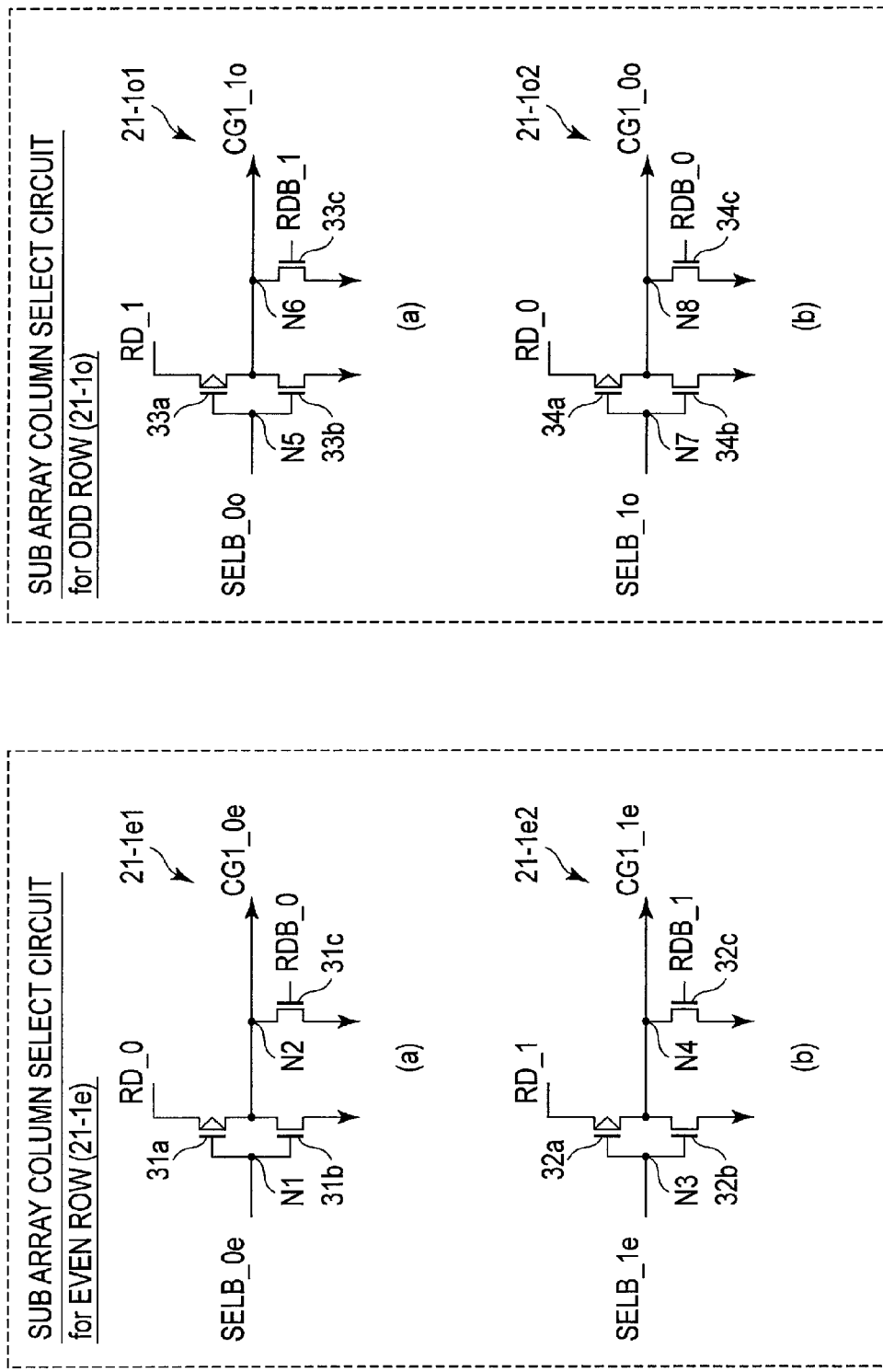

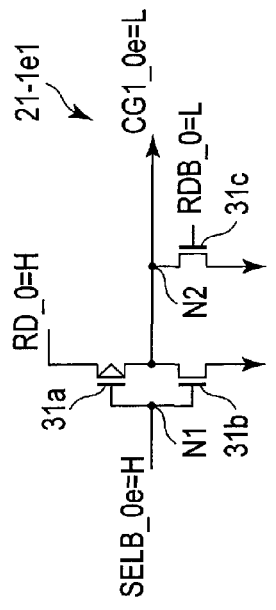
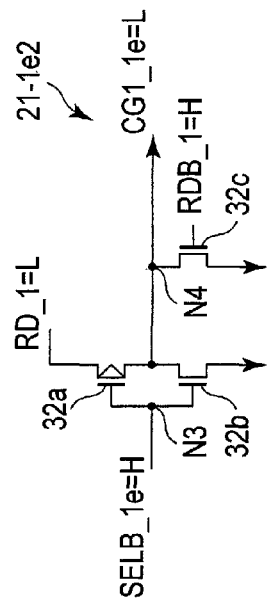
FIG. 12
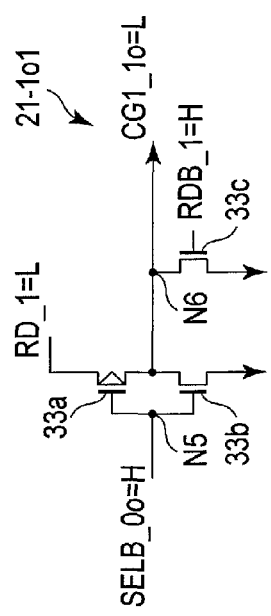
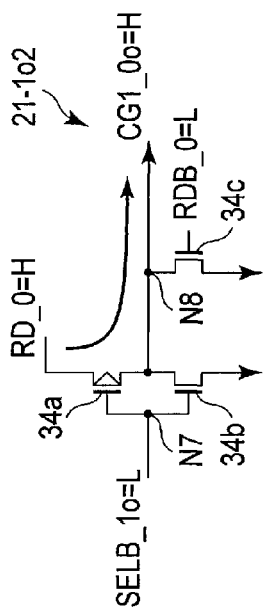
FIG. 11

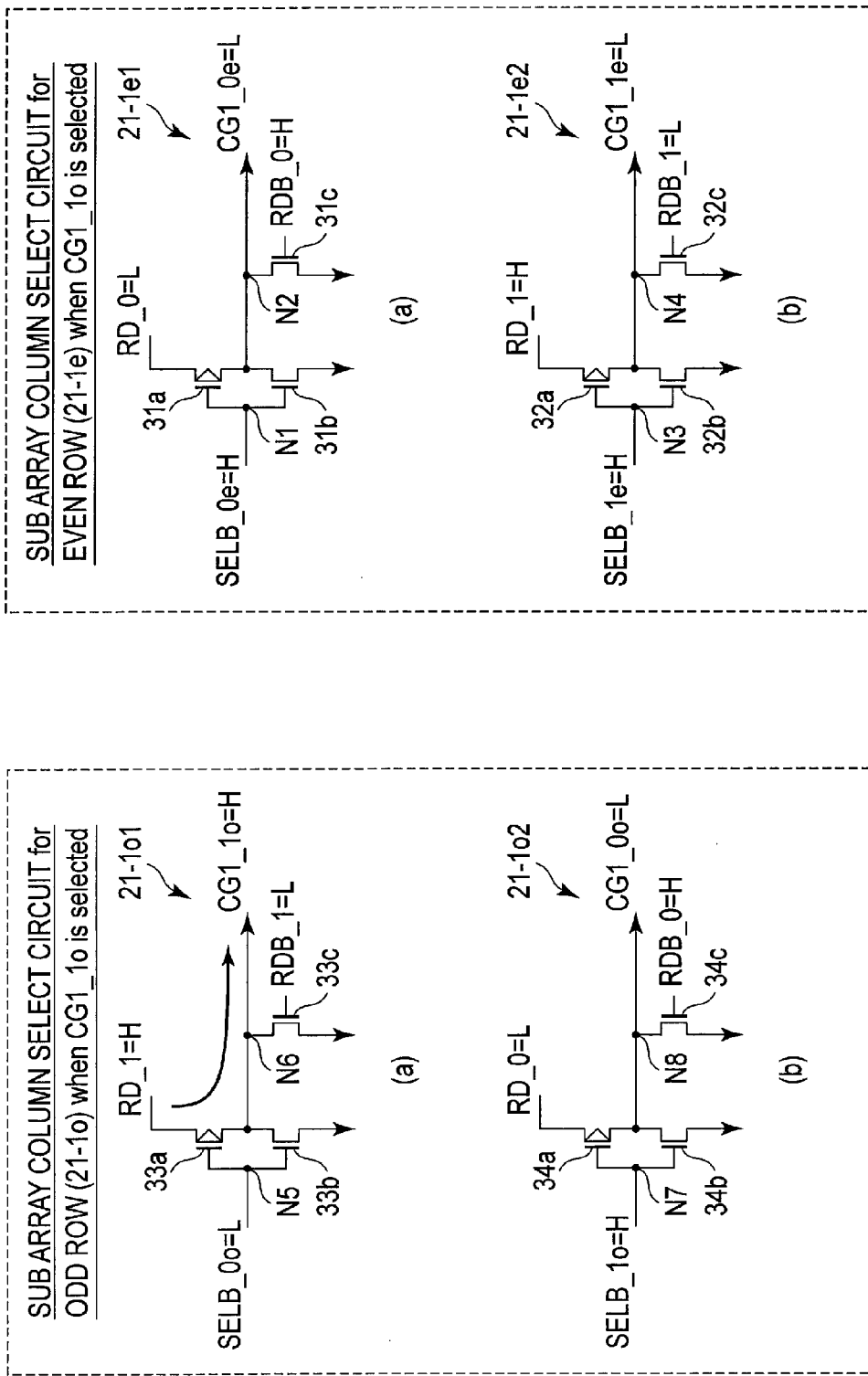

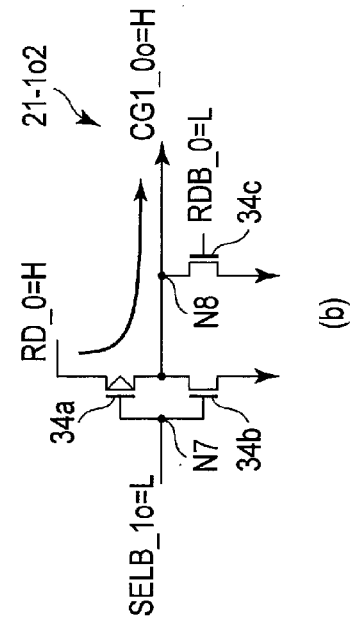
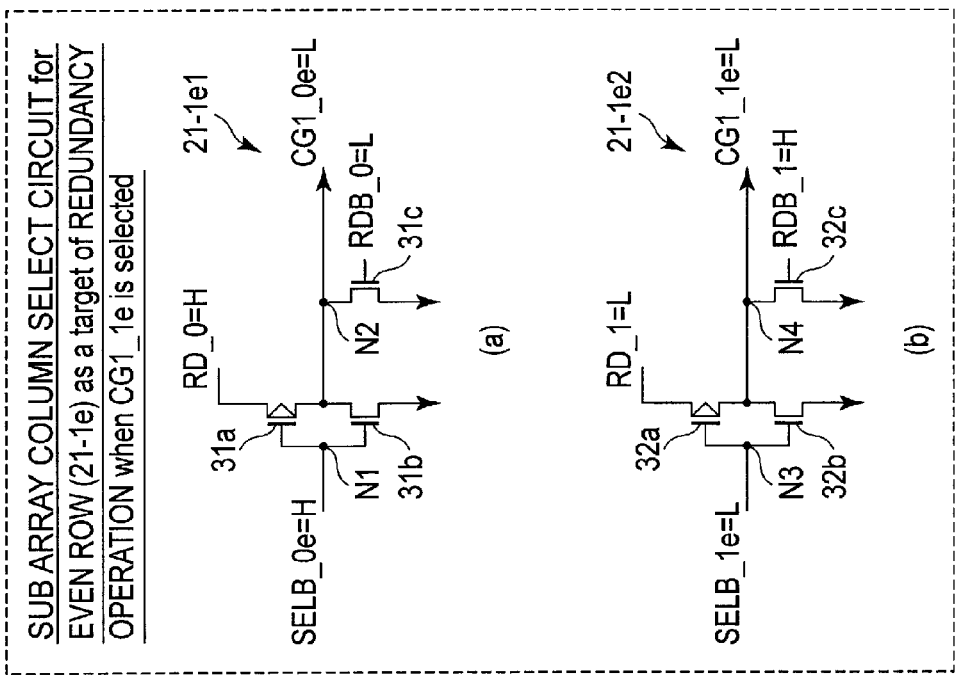
FIG. 17
FIG. 18

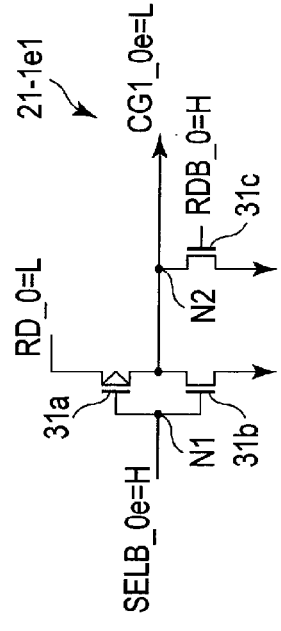
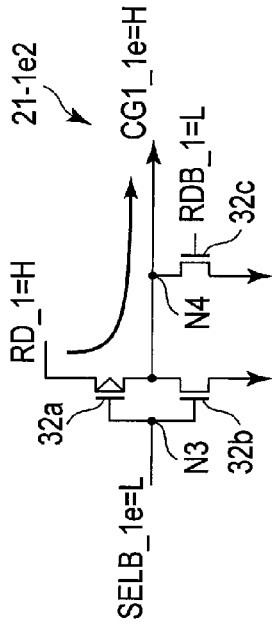
FIG. 20
SUB ARRAY COLUMN SELECT CIRCUIT for EVEN ROW (21-1e) as a target of REDUNDANCY OPERATION when CG1_0o is selected
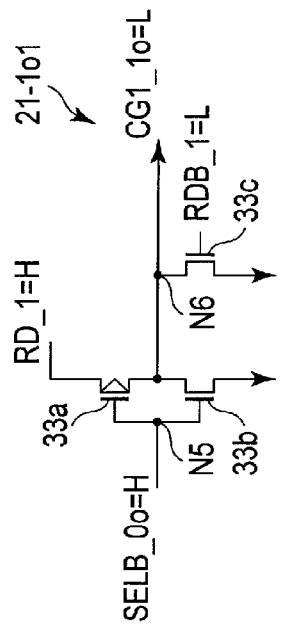
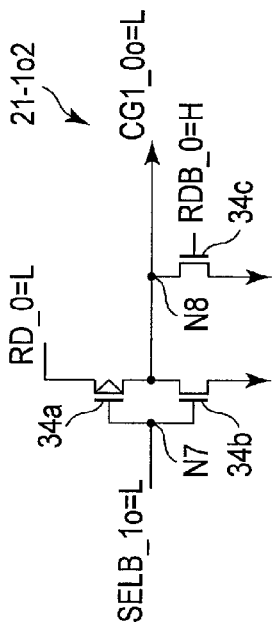
FIG. 19
SUB ARRAY COLUMN SELECT CIRCUIT for ODD ROW (21-1o) as a target of REDUNDANCY OPERATION when CG1_0o is selected

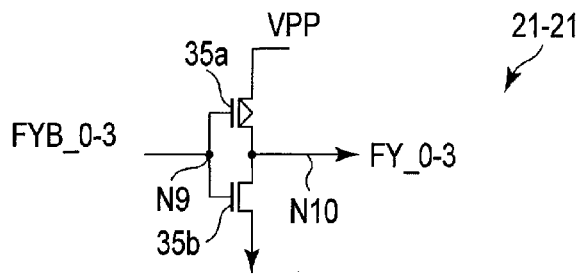
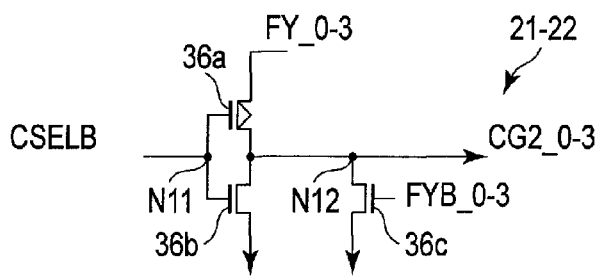
FIG. 23
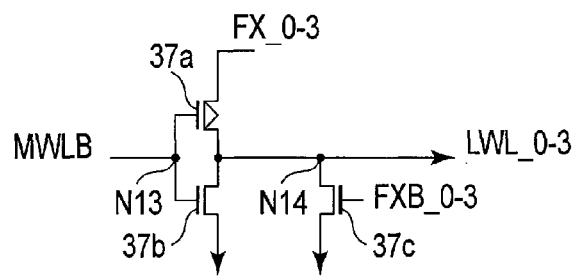
FIG. 24

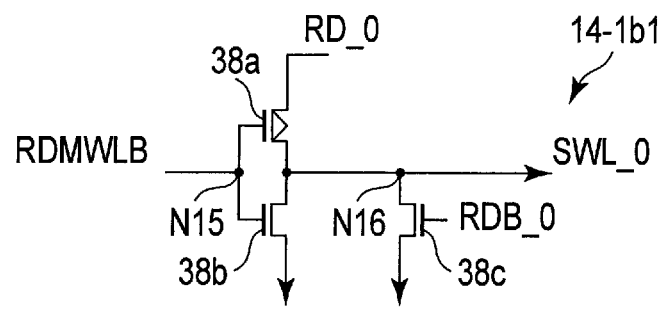
(a)
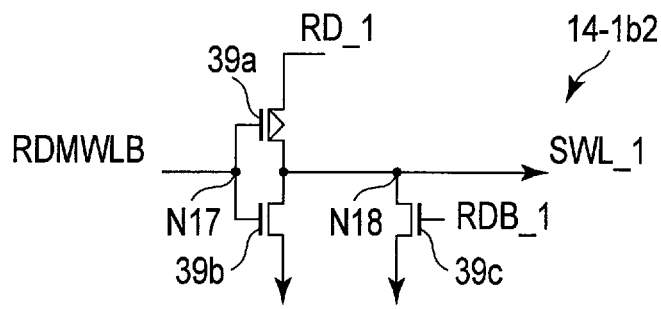
(b)
FIG. 25

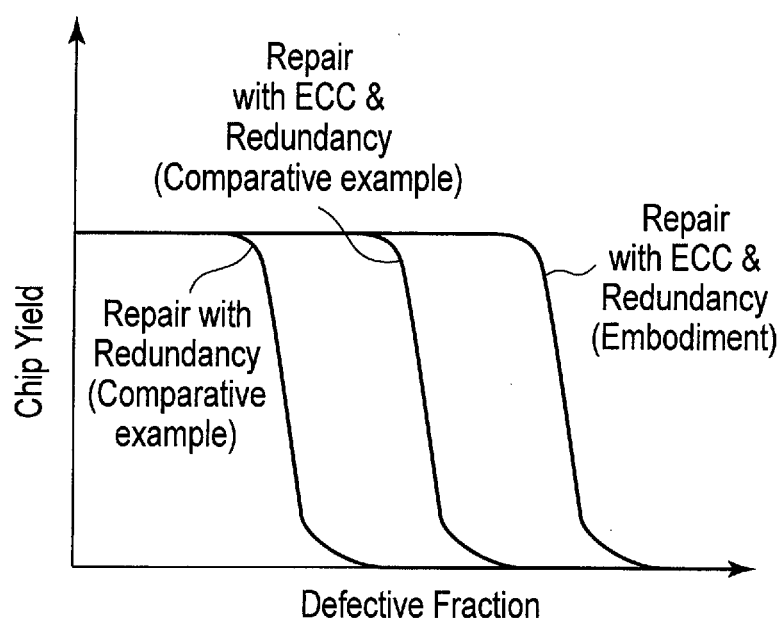
F I G. 29

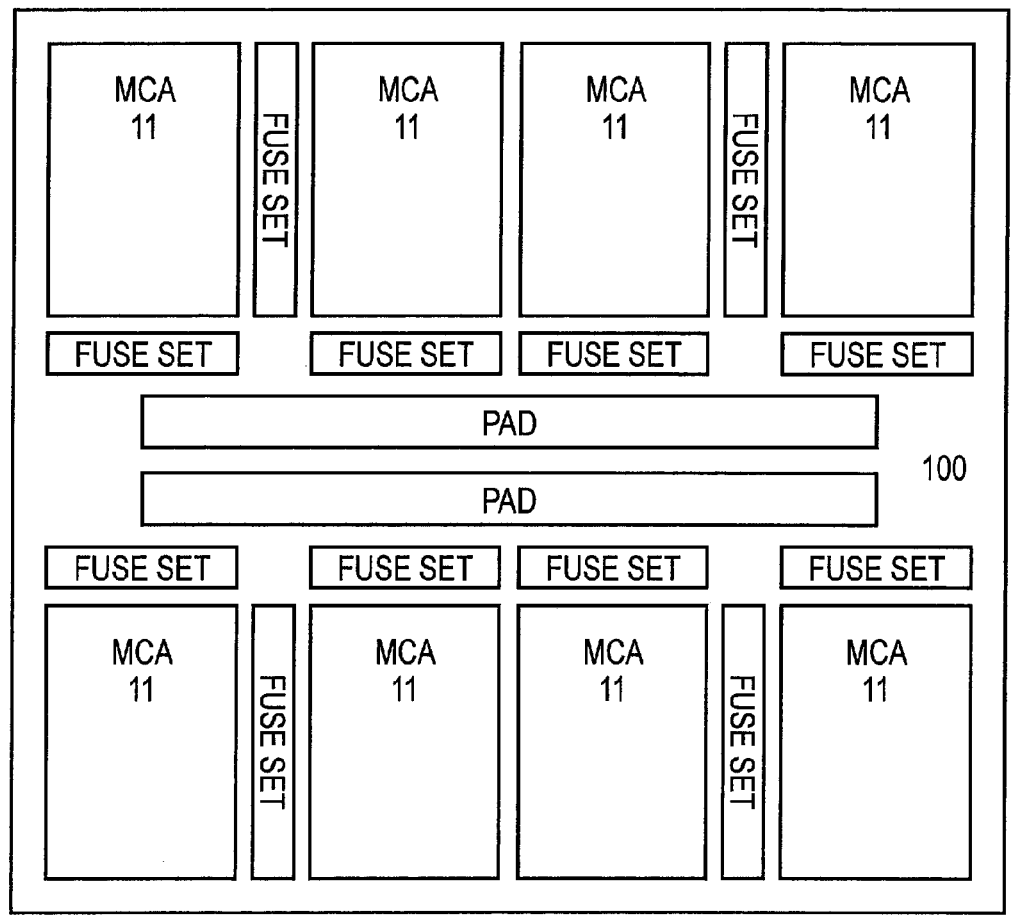
F I G. 30

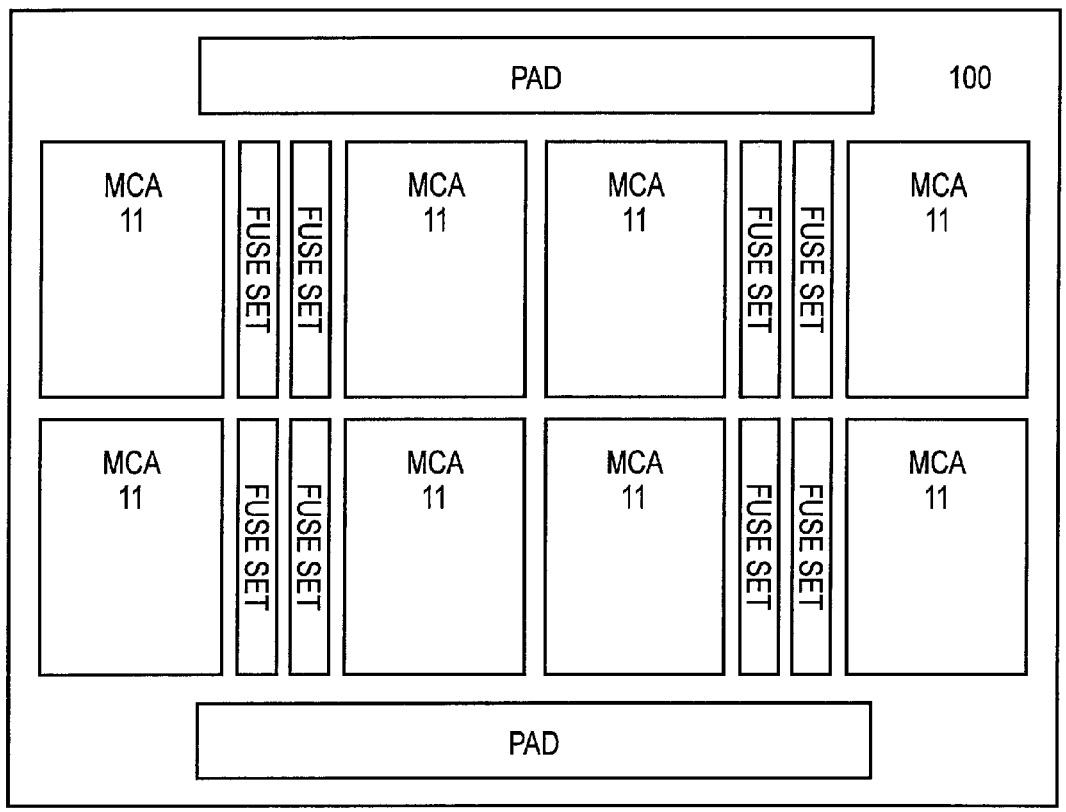
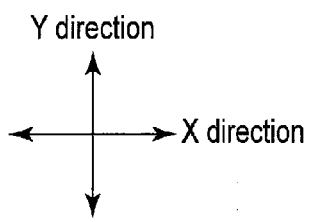
F I G. 31

SEMICONDUCTOR STORAGE DEVICE

CROSS REFERENCE TO RELATED APPLICATIONS

This application claims the benefit of U.S. Provisional Application No. 61/951,935, filed Mar. 12, 2014, the entire contents of which are incorporated herein by reference.

FIELD

Embodiments described herein relate generally to a semiconductor storage device.

BACKGROUND

A magnetic random access memory (MRAM) is a type of resistance change memory. Write methods of the MRAM are a magnetic field write method and spin transfer torque write method. The spin transfer torque write method has a property by which as the size of a magnetic material decreases, a spin transfer torque electric current required for magnetization switching reduces. This makes the spin transfer torque write method advantageous in increasing the degree of integration, decreasing the power consumption, and improving the performance.

An MTJ (Magnetic Tunnel Junction) element of the spin transfer torque write method has a multilayered structure including two ferromagnetic layers and a nonmagnetic barrier layer (thin insulating film) sandwiched between them, and stores digital data by the change in magnetic resistance caused by the spin polarization tunneling effect. The MTJ element can take a low-resistance state and high-resistance state in accordance with the magnetization arrangements in the two ferromagnetic layers. The MTJ element takes the low-resistance state when the magnetization arrangements (spin directions) in the two ferromagnetic layers are in a parallel state (P state), and the high-resistance state when the magnetization arrangements in the two ferromagnetic layers are in an antiparallel state (AP state).

BRIEF DESCRIPTION OF THE DRAWINGS

FIG. 1 is a block diagram showing the arrangement of a semiconductor storage device according to an embodiment;

FIG. 3 is a view showing a write operation of a memory cell according to the embodiment;

FIG. 5 is a circuit diagram of a first sub array column select circuit connected to a sub memory cell array belonging to even rows according to the embodiment;

FIG. 6 is a circuit diagram of a first sub array column select circuit connected to a sub memory cell array belonging to odd rows according to the embodiment;

FIG. 11 is a circuit diagram showing an operation example of the first sub array column select circuit connected to the sub memory cell array belonging to the odd rows according to the embodiment;

FIG. 12 is a circuit diagram showing an operation example of the first sub array column select circuit connected to the sub memory cell array belonging to the even rows according to the embodiment;

FIG. 13 is a circuit diagram showing an operation example of the first sub array column select circuit connected to the sub memory cell array belonging to the odd rows according to the embodiment;

FIG. 14 is a circuit diagram showing an operation example of the first sub array column select circuit connected to the sub memory cell array belonging to the even rows according to the embodiment;

FIG. 17 is a circuit diagram showing an operation example of the first sub array column select circuit connected to the sub memory cell array belonging to the even rows according to the embodiment;

FIG. 18 is a circuit diagram showing an operation example of the first sub array column select circuit connected to the sub memory cell array belonging to the odd rows according to the embodiment;

FIG. 19 is a circuit diagram showing an operation example of the first sub array column select circuit connected to the sub memory cell array belonging to the odd rows according to the embodiment;

FIG. 20 is a circuit diagram showing an operation example of the first sub array column select circuit connected to the sub memory cell array belonging to the even rows according to the embodiment;

FIG. 23 is a circuit diagram of a second sub array column select circuit according to the embodiment;

FIG. 24 is a circuit diagram of a normal word line driver circuit according to the embodiment;

FIG. 25 is a circuit diagram of a redundancy word line driver circuit according to the embodiment;

FIG. 29 is a graph showing the relationship between the defective fraction and chip yield;

FIG. 30 is a block diagram showing a layout example of fuses according to the embodiment; and FIG. 31 is a block diagram showing a layout example of fuses according to the embodiment.

DETAILED DESCRIPTION

Figure 2:
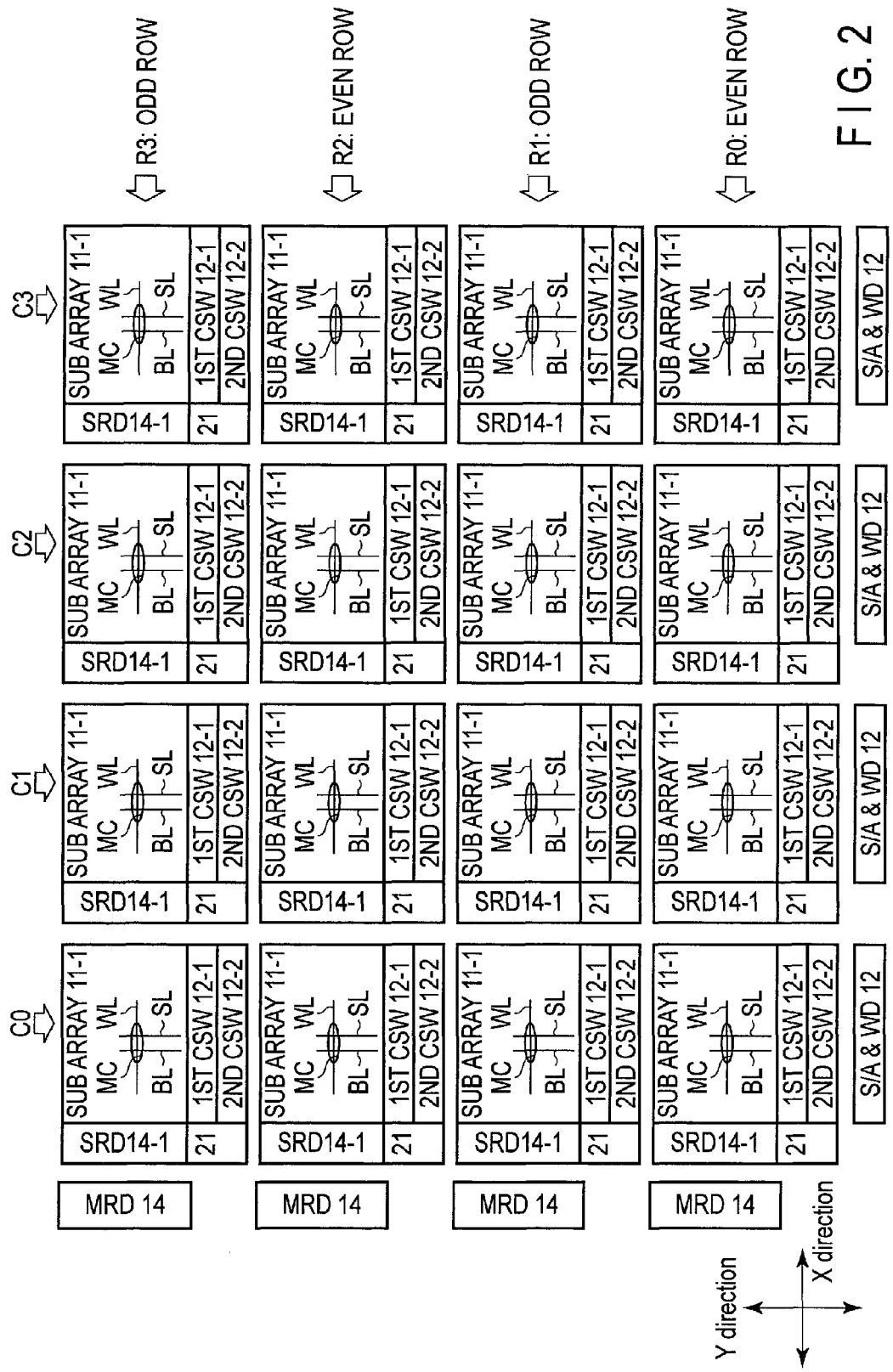
FIG. 2 is a block diagram showing the arrangement of the semiconductor storage device according to the embodiment.

In general, according to one embodiment, a semiconductor storage device includes a first storage area including a plurality of memory cells each including a resistance change element which stores data; a second storage area including a plurality of memory cells each including a resistance change element which stores data; a sub memory cell array including the first storage area and the second storage area: a memory cell array including a plurality of sub memory cell arrays arranged along a column direction and a row direction; a third storage area which stores redundancy information and to supply the redundancy information to the sub memory cell array; and a control circuit which controls an access operation to the memory cell array, wherein when performing an access operation to the first storage area of at least one sub memory cell array belonging to a first row, and to at least one second storage area belonging to a second row, the control circuit performs the access operation to the second storage area of a sub memory cell array belonging to a desired column and to the second row, based on the redundancy information of the third storage area.

The embodiment will be explained below with reference to the accompanying drawings. Note that in the following explanation, the same reference numerals denote constituent elements having substantially the same functions and arrangements, and a repetitive explanation will be made only when necessary. A letter, or hyphen and numeral after a reference number, or a hyphen and numeral after a symbol forming a reference numeral are used to distinguish between elements which are denoted by reference numerals containing the same number and have the same arrangement. When it is unnecessary to distinguish between elements denoted by reference numerals containing the same number, these elements are denoted by reference numerals containing only numbers or symbols. For example, when it is unnecessary to distinguish between elements denoted by reference numerals 1a and 1b, these elements are comprehensively denoted by reference numeral 1. Likewise, when it is unnecessary to distinguish between elements denoted by reference numerals WL1 and WL2, these elements are comprehensively denoted by reference numeral WL.

It should be noted that the drawings are schematic views, so the relationship between the thickness and the planar dimension, the ratio of the thickness of each layer, and the like are different from actual ones. Accordingly, practical thicknesses and dimensions should be judged by referring to the following explanation. Also, the individual drawings of course include portions having different dimensional relationships and different ratios. Furthermore, each embodiment to be explained below exemplifies an apparatus and/or method for embodying the technical idea of the embodiment, and the technical idea of the embodiment does not specify the materials, shapes, structures, layouts, and the like of components to those described below. The technical idea of the embodiment can variously be changed within the scope of the appended claims.

Embodiment

Arrangement of Semiconductor Storage Device According to Embodiment

First, the basic configuration of a semiconductor storage device according to an embodiment will be outlined with reference to FIG. 1. FIG. 1 is a block diagram showing the arrangement of the semiconductor storage device according to the embodiment.

A semiconductor storage device 1 according to the embodiment includes a memory cell array (to be also simply referred to as a cell array hereinafter) 11, sense amplifier/write driver 12, redundancy controller 13, main row decoder 14, DQ circuit 17, controller 18, address command circuit 19, internal voltage generator 20, and array controller 21.

The cell array 11 is an MRAM in which a plurality of memory cells MC are two-dimensionally arranged in a matrix. Details of the cell array 11 will be described later.

The sense amplifier/write driver (to be also referred to as a bit line controller hereinafter) 12 is arranged in the bit-line direction of the memory cell array 11. The sense amplifier/write driver 12 includes a sense amplifier and write driver. The sense amplifier is connected to bit lines BL, and senses an electric current flowing through the memory cell MC connected to a selected word line WL, thereby reading data stored in the memory cell. The write driver is connected to the bit lines BL, and supplies an electric current to the memory cell MC connected to a selected word line WL, thereby writing data to the memory cell. The sense amplifier/write driver 12 controls the bit lines BL and source lines SL based on a control signal from the array controller 21.

The sense amplifier/write driver 12 and an external input/output terminal DQ exchange data via a data bus 16 and the DQ circuit 17.

The redundancy controller 13 is a nonvolatile storage unit such as a laser fuse or fuse array, and stores column redundancy information of each sub memory cell array (to be also referred to as a sub array hereinafter) of the memory cell array 11 (to be described later), and row redundancy information of each sub array of the memory cell array 11. The redundancy controller 13 redundancy controller 13 supplies, e.g., the column redundancy information to the array controller 21 and sense amplifier/write driver 12. Also, the redundancy controller 13 supplies the row redundancy information to the main row decoder 14. The column redundancy information contains, e.g., bit line pair information and column information. The row redundancy information contains, e.g., word line information and row information. Note that the redundancy controller 13 stores the column redundancy information and row redundancy information mainly when, for example, a defective memory cell is found by a test or the like before shipment.

The main row decoder 14 is arranged in the word-line direction of the memory cell array 11, and connected to word lines of the memory cell array 11. The main row decoder 14 decodes the address of a command address signal CAi supplied from the address command circuit 19, and supplies a word line select signal to a sub row decoder.

The controller 18 receives various external control signals such as a chip select signal CS, clock signal CK, and clock enable signal CKE. The controller 18 controls the address command circuit 19, and identifies an address and command. The controller 18 also controls the whole semiconductor storage device 1, and controls an access operation to the memory cell array 11 (to be described later).

The address command circuit 19 receives the command address signal CAi. The address command circuit 19 transfers the command address signal CAi to the main row decoder 14 and array controller 21.

The internal voltage generator 20 generates internal voltages (e.g., a voltage boosted from the power supply voltage) necessary for various operations in the semiconductor storage device 1. The internal voltage generator 20 is also controlled by the controller 18, and generates a necessary voltage by performing the boosting operation.

The array controller 21 generates a signal for controlling a sub row decoder (to be described later) and a switching circuit.

<Memory Cell Array 11>

The memory cell array 11 according to the embodiment will be explained below with reference to FIG. 2.

The memory cell array 11 according to this embodiment is divided into a plurality of sub arrays 11-1. The array controller 21, a sub row decoder 14-1, a first column select circuit 12-1, and a second column select circuit 12-2 are connected to each sub array 11-1.

More specifically, the first column select circuit 12-1 and second column select circuit 12-2 are formed along the two ends of each sub array 11-1 in the X direction. The first column select circuit 12-1 and second column select circuit 12-2 are used to control the sub array 11-1.

In addition, the sub row decoder 14-1 is formed along the two ends of each sub array 11-1 in the Y direction. The sub row decoder 14-1 is used to control the sub array 11-1.

The array controller 21 is formed at the intersection of the column in which the sub row decoder 14-1 is arranged and the row in which the first column select circuit 12-1 and second column select circuit 12-2 are arranged.

In this embodiment, 16 sub arrays 11-1 are arranged in a 4-row×4-column matrix (columns: C0 to C3×rows: R0 to R3), and the main row decoder 14 for selecting a word line for each row is arranged at the end of each row. Also, the sense amplifier/write driver 12 connected to the bit line for each column is arranged at the end of each column. In the sub array 11-1, a plurality of memory cells MC are two-dimensionally arranged in a matrix. Note that when designating a column and row of the sub array 11-1, this will be expressed by (column:row) for the sake of simplicity. For example, the sub array 11-1 in the column C0 and row R0 is expressed as, e.g., a sub array (C0:R0) 11-1. Note that the number of sub arrays 11-1 is not limited to this, and can be changed variously.

Each memory cell MC has a hierarchical structure, and includes an MTJ element 22 (not shown) and cell transistor 23 (not shown). The MTJ element 22 is a magnetic tunnel junction element which stores data in accordance with the change in resistance state, and in which data can be programmed by an electric current. The cell transistor 23 is formed to correspond to the MTJ element 22, and turned on when supplying an electric current to the corresponding MTJ element.

A plurality of word lines WL and a plurality of bit lines BL are arranged in the row direction and column direction, respectively, so as to intersect each other. Two adjacent bit lines BL make a pair, and each memory cell MC is formed at the intersection of the word line WL and the bit line pair (to be referred to as the bit line BL and source line SL in this embodiment for the sake of convenience). The MTJ element 22 and cell transistor 23 of each memory cell MC are connected in series between the pair of bit lines (e.g., between BL and SL). Also, the gate of the cell transistor 23 is connected to the word line WL.

<Write Operation of Memory Cell MC>

A write operation of the memory cell MC according to the embodiment will be outlined below with reference to FIG. 3.

As shown in FIG. 3, one terminal of the MTJ element 22 of the memory cell MC according to the embodiment is connected to the bit line BL, and the other terminal is connected to one end of the current path of the cell transistor 23. The other end of the current path of the cell transistor 23 is connected to the source line SL. The MTJ element 22 using the TMR (Tunneling MagnetoResistive) effect has a multilayered structure including two ferromagnetic layers F and P and a nonmagnetic layer (tunnel insulating film) B sandwiched between them, and stores digital data by the change in magnetic resistance caused by the spin polarization tunneling effect. The MTJ element 22 can take a low-resistance state or high-resistance state in accordance with the magnetization arrangements in the two ferromagnetic layers F and P. For example, 1-bit data can be recorded in the MTJ element 22 by defining the low-resistance state as data "0", and the high-resistance state as data "1". It is, of course, also possible to define the low-resistance state as data "1", and the high-resistance state as data "0".

For example, the MTJ element 22 is formed by sequentially stacking a fixed layer (pinned layer) P, tunnel barrier layer B, and recording layer (free layer) F. The pinned layer P and free layer F are made of a ferromagnetic material, and the tunnel barrier layer B is made of an insulating film (e.g., $Al_2O_3$ or MgO). The pinned layer P is a layer in which the magnetization arrangement direction is fixed. The free layer F has a variable magnetization arrangement direction, and stores data in accordance with the magnetization direction.

When an electric current is supplied in the direction of an arrow µl in a write operation, the magnetization direction in the free layer F becomes antiparallel (AP) to that in the pinned layer P, and the high-resistance state (data "1") is set. When an electric current is supplied in the direction of an arrow A2 in a write operation, the magnetization directions in the pinned layer P and free layer F become parallel (P), and the low-resistance state (data "0") is set. Thus, the MTJ element can write different data in accordance with the direction in which an electric current flows.

<Arrangement of Sub Array and Its Peripheral Circuits According to Embodiment>

The layout of the sub array and its peripheral circuits according to the embodiment will be outlined below with reference to FIG. 4.

Figure 4:
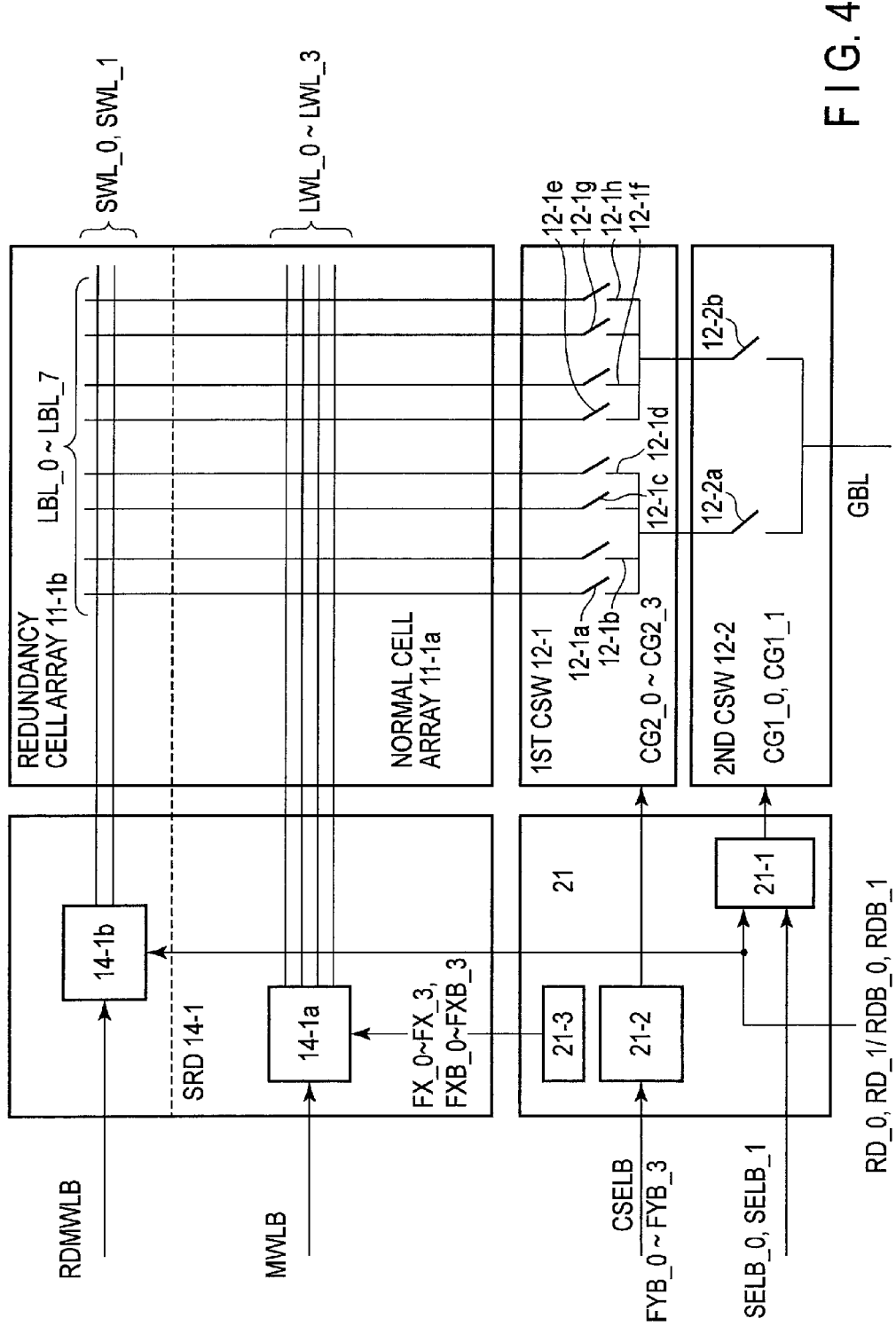
FIG. 4 is a block diagram showing the relationship between a sub memory cell array and its peripheral circuits according to the embodiment.

As shown in FIG. 4, the sub array 11-1 is divided into a normal cell array 11-1*a* and redundancy cell array 11-1*b*.

The array controller 21 includes a first sub array column select circuit (first circuit) 21-1, second sub array column select circuit (second circuit) 21-2, and sub array row select circuit 21-3.

The first sub array column select circuit 21-1 receives redundancy signals RD (RD_0, RD_1, RDB_0, and RDB_1) from the redundancy controller 13, and receives control signals SELB (SELB_0 and SELB_1) from the address control circuit 19. Based on the received redundancy signals RD and control signals SELB, the first sub array column select circuit 21-1 supplies control signals CG1 (CG1_0 and CG1_1) to the second column select switch 12-2. Also, as will be described later, the first sub array column select circuit 21-1 includes different circuits for even (2n: n is an integer of 0 or more) rows (R0 and R2), and odd (2n+1: n is an integer of 0 or more) rows (R1 and R3).

The second sub array column select circuit 21-2 receives a control signal CSELB and control signals FYB (FYB_0 to FYB_3) from the address control circuit 19. Based on the received control signals CSELB and FYB, the second sub array column select circuit 21-2 supplies control signals CG2 (CG2_0 to CG2_3) to the first column select switch 12-1.

The sub array row select circuit 21-3 receives the control signals from the address control circuit 19, and supplies select signals FX (FX_0 to FX_3 and FXB_0 to FXB_3).

The sub row decoder 14-1 includes a normal word line driver 14-1a, and redundancy word line driver 14-1b.

The normal word line driver 14-1a receives a control signal MWLB from the main row decoder 14, and receives the control signals FX and FXB from the sub array row select circuit 21-3. Based on the received control signal MWLB and control signals FX and FXB, the normal word line driver 14-1a supplies a voltage to local word lines LWL (LWL_0 to LWL_3) of the normal cell array 11-1a.

The redundancy word line driver 14-1b receives the redundancy signals RD (RD_0, RD_1, RDB_0, and RDB_1) from the redundancy controller 13, and receives a redundancy signal RDMWLB from the redundancy controller 13. Based on the received redundancy signals RD and redundancy signal RDMWLB, the redundancy word line driver 14-1b supplies a voltage to local word lines SWL (SWL_0 and SWL_1) of the redundancy cell array 11-1b.

The second column select switch 12-2 includes, e.g., two switches 12-2a and 12-2b each having a current path having one end connected to a global bit line GBL. The two switches 12-2a and 12-2b are turned on or off based on the control signal CG1 supplied from the first sub array column select circuit 21-1.

The first column select switch 12-1 includes, e.g., four switches 12-1a, 12-1b, 12-1c, and 12-1d each having a current path having one end connected to a local bit line LBL, and the other end connected to the other end of the current path of the switch 12-2a. The first column select switch 12-1 also includes four switches 12-1e, 12-1f, 12-1g, and 12-1h each having a current path having one end connected to a local bit line LBL, and the other end connected to the other end of the current path of the switch 12-2b.

These eight switches are turned on or off based on the select signals CG2 supplied from the second sub array column select circuit 21-2.

Note that the local bit lines LBL are common to normal cells and redundancy cells. Note also that the local bit lines LBL are connected to the global bit line GBL via the first column select switch 12-1 and second column select switch 12-2.

The local word lines LWL, local bit lines LBL, switches, various signals, and the like described above are merely examples, and can be changed as needed.

<First Sub Array Column Select Circuit>

Next, the first sub array column select circuit 21-1 according to this embodiment will be explained with reference to FIGS. 5 to 22.

As described above, the first sub array column select circuit 21-1 includes different circuits for the even rows (R0 and R2) and odd rows (R1 and R3).

A sub array column select circuit 21-1e corresponding to the even rows will be explained with reference to FIG. 5.

As indicated by (a) in FIG. 5, the sub array column select circuit 21-1e includes a PMOS transistor 31a and NMOS transistors 31b and 31c as a circuit 21-1e1 for outputting a control signal CG1_0e.

The PMOS transistor 31a includes a gate electrode to which a control signal SELB_0e is input via a node N1, and a current path having one end to which the redundancy signal RD_0 is input, and the other end connected to a node N2.

The NMOS transistor 31b includes a gate electrode to which the control signal SELB_0e is input via the node N1, and a current path having one end connected to the node N2, and the other end connected to the ground potential.

The NMOS transistor 31c includes a gate electrode to which the redundancy signal RDB_0 is input, and a current path having one end connected to the node N2, and the other end connected to the ground potential. The voltage of the node N2 is output as the control signal CG1_0e.

As indicated by (b) in FIG. 5, the sub array column select circuit 21-1e includes a PMOS transistor 32a and NMOS transistors 32b and 32c as a circuit 21-1e2 for outputting a control signal CG1_1e.

The PMOS transistor 32a includes a gate electrode to which a control signal SELB_1e is input via a node N3, and a current path having one end to which the redundancy signal RD_1 is input, and the other end connected to a node N4.

The NMOS transistor 32b includes a gate electrode to which the control signal SELB_1e is input via the node N3, and a current path having one end connected to the node N4, and the other end connected to the ground potential.

The NMOS transistor 32c includes a gate electrode to which the redundancy signal RDB_1 is input, and a current path having one end connected to the node N4, and the other end connected to the ground potential. The voltage of the node N4 is output as the control signal CG1_1e.

A sub array column select circuit 21-1o corresponding to the odd rows will be explained with reference to FIG. 6.

As indicated by (a) in FIG. 6, the sub array column select circuit 21-1o includes a PMOS transistor 33a and NMOS transistors 33b and 33c as a circuit 21-1o1 for outputting a control signal CG1_1o.

The PMOS transistor 33a includes a gate electrode to which a control signal SELB_0o is input via a node N5, and a current path having one end to which the redundancy signal RD_1 is input, and the other end connected to a node N6.

The NMOS transistor 33b includes a gate electrode to which the control signal SELB_0o is input via the node N5, and a current path having one end connected to the node N6, and the other end connected to the ground potential.

The NMOS transistor 33c includes a gate electrode to which the redundancy signal RDB_1 is input, and a current path having one end connected to the node N6, and the other end connected to the ground potential. The voltage of the node N6 is output as the control signal CG1_1o.

As indicated by (b) in FIG. 6, the sub array column select circuit 21-1o includes a PMOS transistor 34a and NMOS transistors 34b and 34c as a circuit 21-1o2 for outputting a control signal CG1_0o.

The PMOS transistor 34a includes a gate electrode to which a control signal SELB_1o is input via a node N7, and a current path having one end to which the redundancy signal RD_0 is input, and the other end connected to a node N8.

The NMOS transistor 34b includes a gate electrode to which the control signal SELB_1o is input via the node N8, and a current path having one end connected to the node N8, and the other end connected to the ground potential.

The NMOS transistor 34c includes a gate electrode to which the redundancy signal RDB_0 is input, and a current path having one end connected to the node N8, and the other end connected to the ground potential. The voltage of the node N8 is output as the control signal CG1_0o.

As shown in FIGS. 5 and 6, in the first sub array column select circuits corresponding to the even rows and odd rows, the control signals SELB_0 and SELB_1 and the output signals CG1_0 and CG1_1 have a crossed relationship.

Also, when setting the first sub array column select circuit 21-1 in an "unselected state", both the output signals CG1_0 and CG1_1 are changed to level "L (Low)". When setting the first sub array column select circuit 21-1 in a "selected state", one of the output signals CG1_0 and CG1_1 is changed to "H", and the other is changed to "L".

<Even Row Selecting Operation (Normal Operation)>

The operations of the sub array column select circuits 21-1e and 21-1o when outputting the control signal CG1_0e at level "H (High)" will be explained below with reference to FIGS. 7 and 8.

Figures 7, 8:
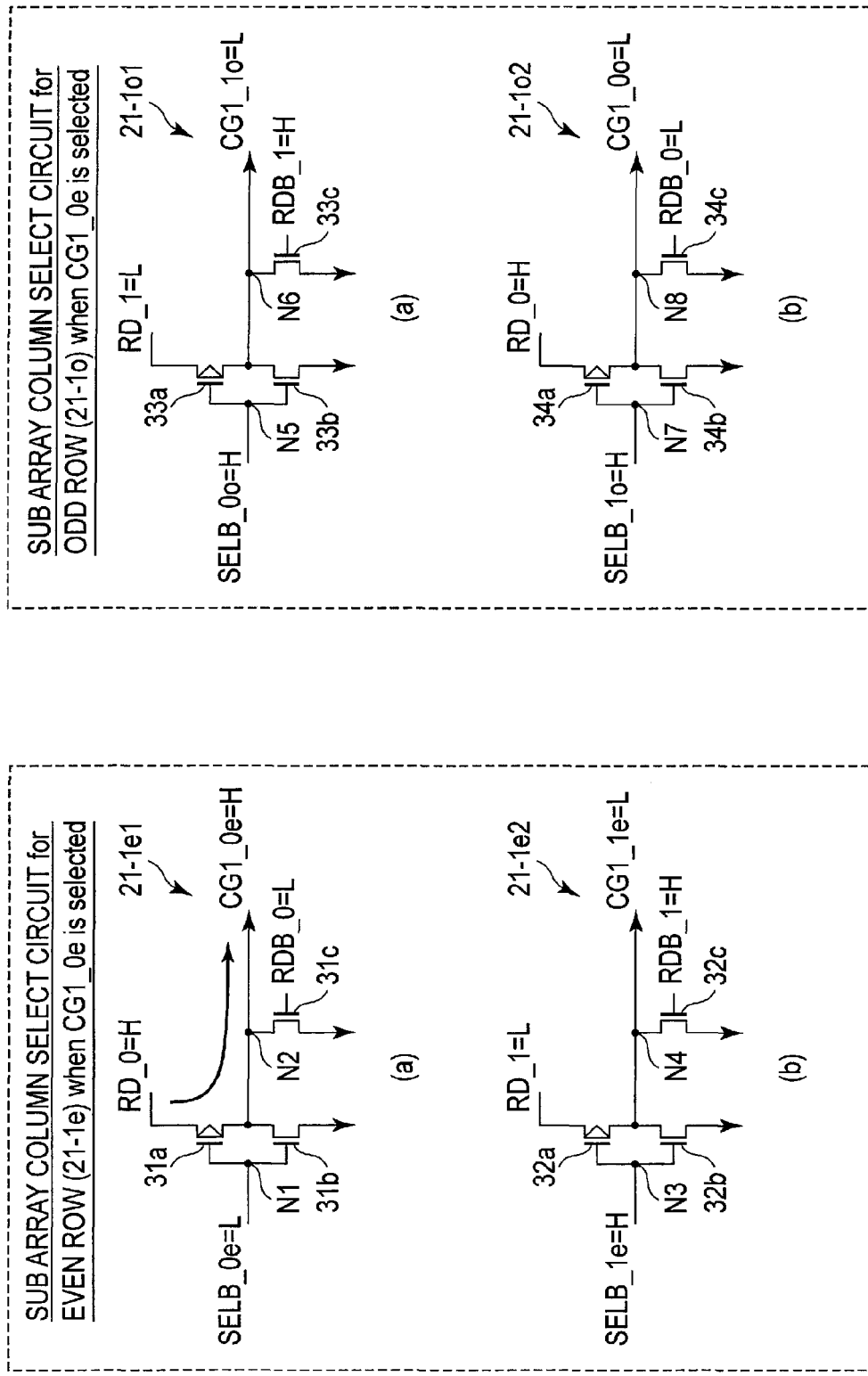
FIG. 7 is a circuit diagram showing an operation example of the first sub array column select circuit connected to the sub memory cell array belonging to the even rows according to the embodiment.
FIG. 8 is a circuit diagram showing an operation example of the first sub array column select circuit connected to the sub memory cell array belonging to the odd rows according to the embodiment.

As shown in FIG. 7, in the sub array column select circuit 21-1e1, the redundancy signal RD_0 is "H", the redundancy signal RDB_0 is "L", and the control signal SELB_0e is "L". Therefore, the node N2 is "H", and the control signal CG1_0e is "H".

Also, in the sub array column select circuit 21-1e2, the redundancy signal RD_1 is "L", the redundancy signal RDB_1 is "H", and the control signal SELB_1e is "H". Accordingly, the node N4 is "L", and the control signal CG1_1e is "L".

As shown in FIG. 8, in the sub array column select circuit 21-1o1, the redundancy signal RD_1 is "L", the redundancy signal RDB_1 is "H", and the control signal SELB_0o is "H". Therefore, the node N6 is "L", and the control signal CG1_1o is "L".

Furthermore, in the sub array column select circuit 21-1o2, the redundancy signal RD_0 is "H", the redundancy signal RDB_0 is "L", and the control signal SELB_1o is "H". Accordingly, the node N8 is "L", and the control signal CG1_0o is "L".

Next, the operations of the sub array column select circuits 21-1e and 21-1o when outputting the control signal CG1_1e at level "H" will be explained with reference to FIGS. 9 and 10.

Figure 9:
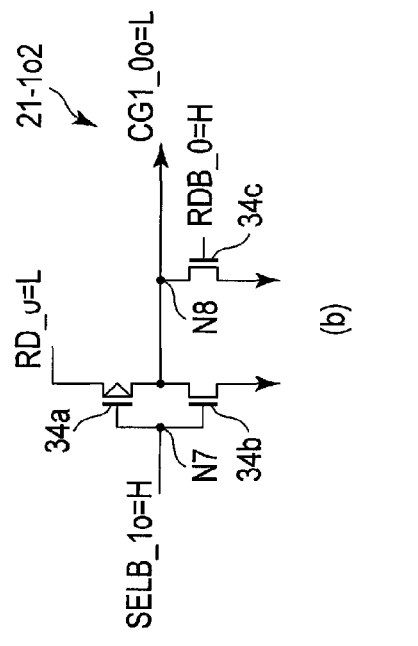
FIG. 9 is a circuit diagram showing an operation example of the first sub array column select circuit connected to the sub memory cell array belonging to the even rows according to the embodiment.

As shown in FIG. 9, in the sub array column select circuit 21-1e1, the redundancy signal RD_0 is "L", the redundancy signal RDB_0 is "H", and the control signal SELB_0e is "H". Therefore, the node N2 is "L", and the control signal CG1_0e is "L".

Also, in the sub array column select circuit 21-1e2, the redundancy signal RD_1 is "H", the redundancy signal RDB_1 is "L", and the control signal SELB_1e is "L". Accordingly, the node N4 is "H", and the control signal CG1_1e is "H".

Figure 10:
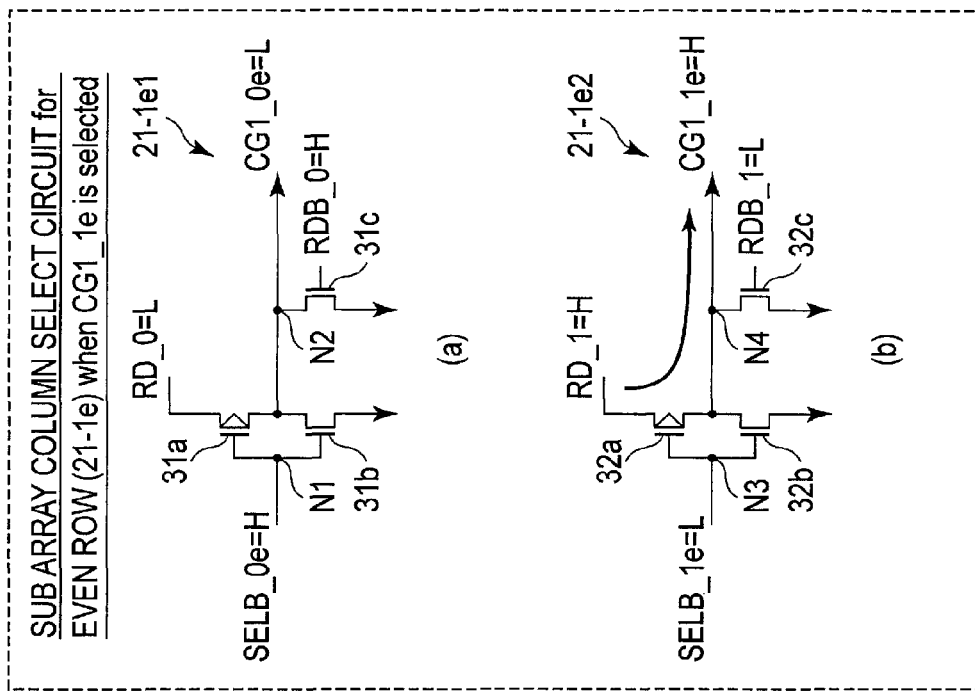
FIG. 10 is a circuit diagram showing an operation example of the first sub array column select circuit connected to the sub memory cell array belonging to the odd rows according to the embodiment.

As shown in FIG. 10, in the sub array column select circuit 21-1o1, the redundancy signal RD_1 is "H", the redundancy signal RDB_1 is "L", and the control signal SELB_0o is "H". Therefore, the node N6 is "L", and the control signal CG1_1o is "L".

Furthermore, in the sub array column select circuit 21-1o2, the redundancy signal RD_0 is "L", the redundancy signal RDB_0 is "H", and the control signal SELB_1o is "H". Accordingly, the node N8 is "L", and the control signal CG1_0o is "L".

<Odd Row Selecting Operation (Normal Operation)>

The operations of the sub array column select circuits 21-1o and 21-1e when outputting the control signal CG1_0o at level "H" will be explained below with reference to FIGS. 11 and 12.

As shown in FIG. 11, in the sub array column select circuit 21-1o1, the redundancy signal RD_1 is "L", the redundancy signal RDB_1 is "H", and the control signal SELB_0o is "H". Therefore, the node N6 is "L", and the control signal CG1_1o is "L".

Also, in the sub array column select circuit 21-1o2, the redundancy signal RD_0 is "H", the redundancy signal RDB_0 is "L", and the control signal SELB_1o is "L". Accordingly, the node N8 is "H", and the control signal CG1_0o is "H".

As shown in FIG. 12, in the sub array column select circuit 21-1e1, the redundancy signal RD_0 is "H", the redundancy signal RDB_0 is "L", and the control signal SELB_0e is "H". Therefore, the node N2 is "L", and the control signal CG1_0e is "L".

Furthermore, in the sub array column select circuit 21-1e2, the redundancy signal RD_1 is "L", the redundancy signal RDB_1 is "H", and the control signal SELB_1e is "H". Accordingly, the node N4 is "L", and the control signal CG1_1e is "L".

Next, the operations of the sub array column select circuits 21-1o and 21-1e when outputting the control signal CG1_1o at level "H" will be explained with reference to FIGS. 13 and 14.

As shown in FIG. 13, in the sub array column select circuit 21-1o1, the redundancy signal RD_1 is "H", the redundancy signal RDB_1 is "L", and the control signal SELB_0o is "L". Therefore, the node N6 is "H", and the control signal CG1_1o is "H".

Also, in the sub array column select circuit 21-1o2, the redundancy signal RD_0 is "L", the redundancy signal RDB_0 is "H", and the control signal SELB_1o is "H". Accordingly, the node N8 is "L", and the control signal CG1_0o is "L".

As shown in FIG. 14, in the sub array column select circuit 21-1e1, the redundancy signal RD_0 is "L", the redundancy signal RDB_0 is "H", and the control signal SELB_0e is "H". Therefore, the node N2 is "L", and the control signal CG1_0e is "L".

Furthermore, in the sub array column select circuit 21-1e2, the redundancy signal RD_1 is "H", the redundancy signal RDB_1 is "L", and the control signal SELB_1e is "H". Accordingly, the node N4 is "L", and the control signal CG1_1e is "L".

<Even Row Selecting Operation (Redundancy Operation)>

Next, the operations of the sub array column select circuits 21-1e and 21-1o as targets of the redundancy operation will be explained with reference to FIGS. 15 to 18. The operation shown in FIGS. 7 to 10 described earlier is performed on a sub array for which no redundancy operation is performed, and the following operation is performed on a sub array for which the redundancy operation is performed. Note that when the redundancy operation is performed on any column while even rows are selected, odd rows are selected in this column. In the following description, the operation of a sub array as a target of the redundancy operation as described above will be explained.

The operations of the sub array column select circuits 21-1e and 21-1o as targets of the redundancy operation when outputting the control signal CG1_0e at level "H" will be explained with reference to FIGS. 15 and 16.

Figures 15, 16:
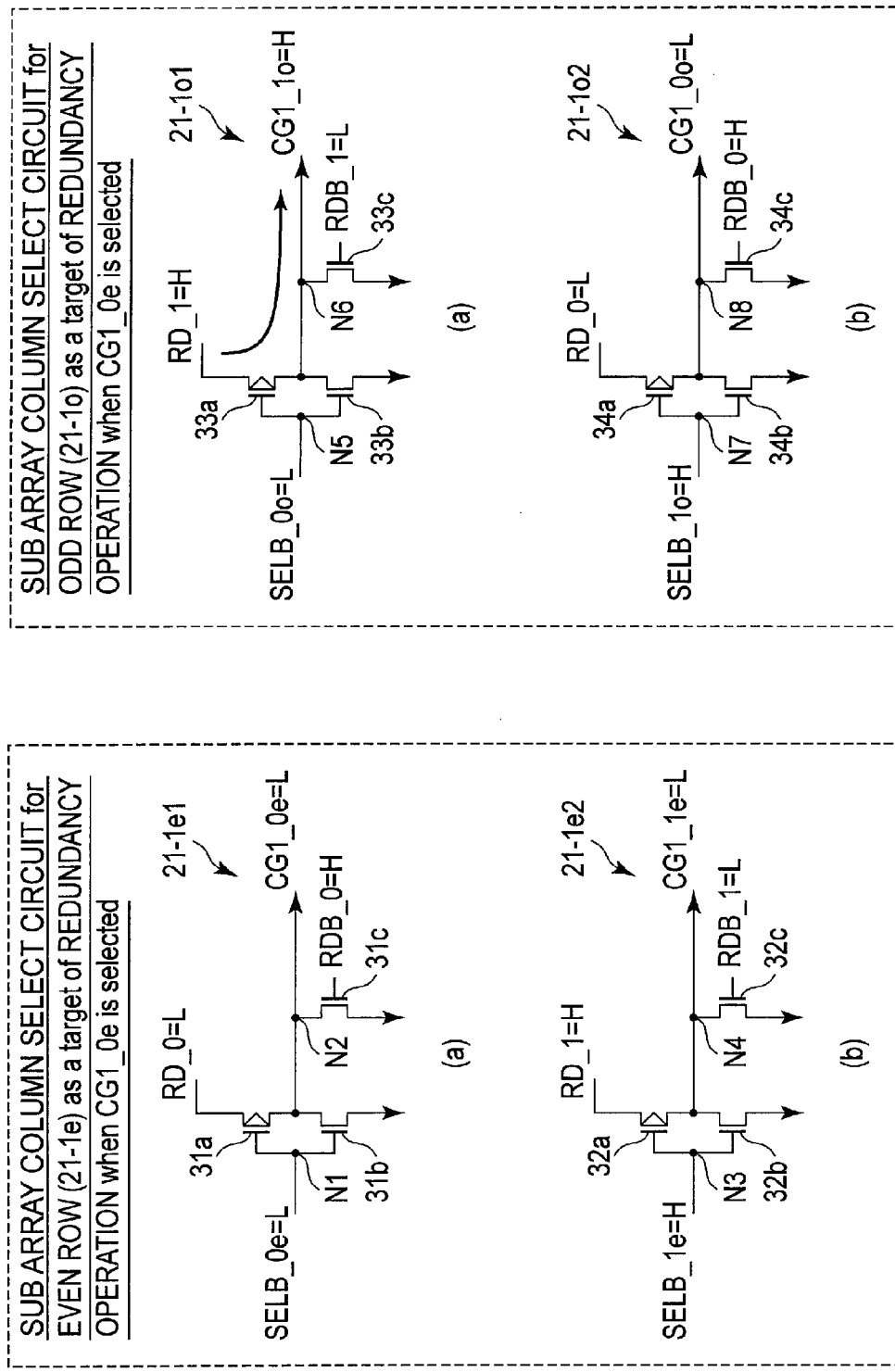
FIG. 15 is a circuit diagram showing an operation example of the first sub array column select circuit connected to the sub memory cell array belonging to the even rows according to the embodiment.
FIG. 16 is a circuit diagram showing an operation example of the first sub array column select circuit connected to the sub memory cell array belonging to the odd rows according to the embodiment.

As shown in FIG. 15, in the sub array column select circuit 21-1e1, the redundancy signal RD_0 is "L", the redundancy signal RDB_0 is "H", and the control signal SELB_0e is "L". Therefore, the node N2 is "H", and the control signal CG1_0e is "L".

Also, in the sub array column select circuit 21-1e2, the redundancy signal RD_1 is "H", the redundancy signal RDB_1 is "L", and the control signal SELB_1e is "H". Accordingly, the node N4 is "L", and the control signal CG1_1e is "L".

As shown in FIG. 16, in the sub array column select circuit 21-1o1, the redundancy signal RD_1 is "H", the redundancy signal RDB_1 is "L", and the control signal SELB_0o is "L". Therefore, the node N6 is "H", and the control signal CG1_1o is "H".

Furthermore, in the sub array column select circuit 21-1o2, the redundancy signal RD_0 is "L", the redundancy signal RDB_0 is "H", and the control signal SELB_1o is "H". Accordingly, the node N8 is "L", and the control signal CG1_0o is "L".

Next, the operations of the sub array column select circuits 21-1e and 21-1o as targets of the redundancy operation when outputting the control signal CG1_1e at level "H" will be explained with reference to FIGS. 17 and 18.

As shown in FIG. 17, in the sub array column select circuit 21-1e1, the redundancy signal RD_0 is "H", the redundancy signal RDB_0 is "L", and the control signal SELB_0e is "H". Therefore, the node N2 is "L", and the control signal CG1_0e is "L".

Also, in the sub array column select circuit 21-1e2, the redundancy signal RD_1 is "L", the redundancy signal RDB_1 is "H", and the control signal SELB_1e is "L". Accordingly, the node N4 is "L", and the control signal CG1_1e is "L".

As shown in FIG. 18, in the sub array column select circuit 21-1o1, the redundancy signal RD_1 is "L", the redundancy signal RDB_1 is "H", and the control signal SELB_0o is "H". Therefore, the node N6 is "L", and the control signal CG1_1o is "L".

Furthermore, in the sub array column select circuit 21-1o2, the redundancy signal RD_0 is "H", the redundancy signal RDB_0 is "L", and the control signal SELB_1o is "L". Accordingly, the node N8 is "H", and the control signal CG1_0o is "H".

<Odd Row Selecting Operation (Redundancy Operation)>

The operations of the sub array column select circuits 21-1e and 21-1o as targets of the redundancy operation will be explained below with reference to FIGS. 19 to 22. The operation shown in FIGS. 11 to 14 described earlier is performed on a sub array for which no redundancy operation is performed, and the following operation is performed on a sub array for which the redundancy operation is performed. Note that when the redundancy operation is performed on any column while odd rows are selected, even rows are selected in this column. In the following description, the operation of a sub array as a target of the redundancy operation as described above will be explained.

The operations of the sub array column select circuits 21-1o and 21-1e as targets of the redundancy operation when outputting the control signal CG1_0o at level "H" will be explained below with reference to FIGS. 19 and 20.

As shown in FIG. 19, in the sub array column select circuit 21-1o1, the redundancy signal RD_1 is "H", the redundancy signal RDB_1 is "L", and the control signal SELB_0o "H". Therefore, the node N6 is "L", and the control signal CG1_1o is "L".

Also, in the sub array column select circuit 21-1o2, the redundancy signal RD_0 is "L", the redundancy signal RDB_0 is "H", and the control signal SELB_0o is "L". Accordingly, the node N8 is "L", and the control signal CG1_0o is "L".

As shown in FIG. 20, in the sub array column select circuit 21-1e1, the redundancy signal RD_0 is "L", the redundancy signal RDB_0 is "H", and the control signal SELB_0e is "H". Therefore, the node N2 is "L", and the control signal CG1_0e is "L".

Furthermore, in the sub array column select circuit 21-1e2, the redundancy signal RD_1 is "H", the redundancy signal RDB_1 is "L", and the control signal SELB_1e is "L". Accordingly, the node N4 is "H", and the control signal CG1_1e is "H".

Next, the operations of the sub array column select circuits 21-1o and 21-1e as targets of the redundancy operation when outputting the control signal CG1_1o at level "H" will be explained with reference to FIGS. 21 and 22.

Figures 21, 22:
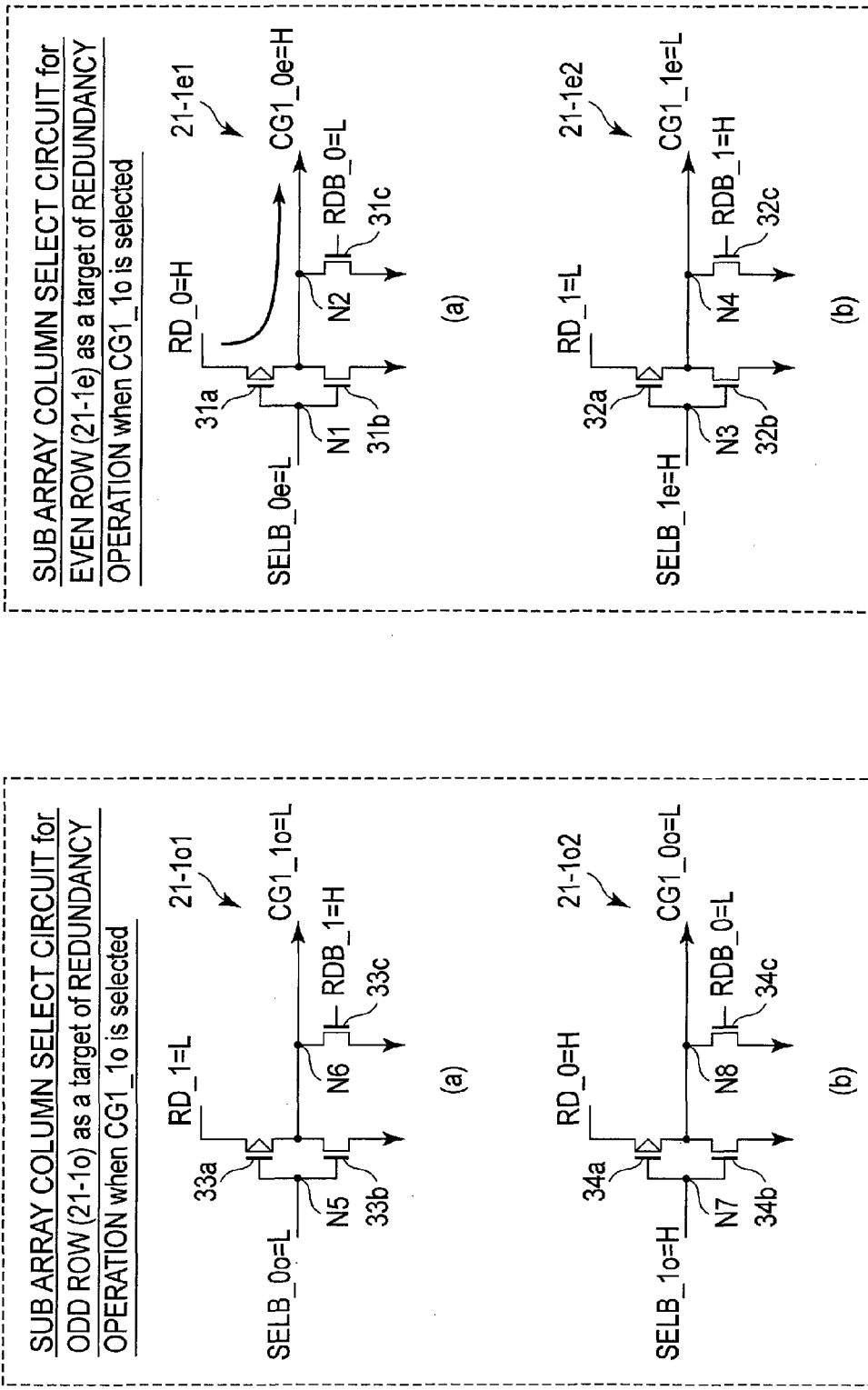
FIG. 21 is a circuit diagram showing an operation example of the first sub array column select circuit connected to the sub memory cell array belonging to the odd rows according to the embodiment.
FIG. 22 is a circuit diagram showing an operation example of the first sub array column select circuit connected to the sub memory cell array belonging to the even rows according to the embodiment.

As shown in FIG. 21, in the sub array column select circuit 21-1o1, the redundancy signal RD_1 is "L", the redundancy signal RDB_1 is "H", and the control signal SELB_0o is "L". Therefore, the node N6 is "L", and the control signal CG1_1o is "L".

Also, in the sub array column select circuit 21-1o2, the redundancy signal RD_0 is "H", the redundancy signal RDB_0 is "L", and the control signal SELB_1o is "H". Accordingly, the node N8 is "L", and the control signal CG1_0o is "L".

As shown in FIG. 22, in the sub array column select circuit 21-1e1, the redundancy signal RD_0 is "H", the redundancy signal RDB_0 is "L", and the control signal SELB_0e is "L". Therefore, the node N2 is "H", and the control signal CG1_0e is "H".

Furthermore, in the sub array column select circuit 21-1e2, the redundancy signal RD_1 is "L", the redundancy signal RDB_1 is "H", and the control signal SELB_0e is "H". Accordingly, the node N4 is "L", and the control signal CG1_1e is "L".

In the redundancy operation as described above, a redundancy area of a sub array belonging to another row can be selected by changing only the redundancy signal RD without changing the signal SELB.

<Second Sub Array Column Select Circuit>

Next, the second sub array column select circuit 21-2 according to this embodiment will be explained with reference to FIG. 23.

As indicated by (a) in FIG. 23, the sub array column select circuit 21-2 includes a PMOS transistor 35a and NMOS transistor 35b as 21-21 for outputting the control signals FY_0 to FY_3.

The PMOS transistor 35a includes a gate electrode to which the control signals FYB_0 to FYB_3 are input via a node N9, and a current path having one end to which a voltage VPP is input, and the other end connected to a node N10.

The NMOS transistor 35b includes a gate electrode to which the control signals FYB_0 to FYB_3 are input via the node N9, and a current path having one end connected to the node N10, and the other end connected to the ground potential. The voltage of the node N10 is output as the control signals FY_0 to FY_3.

As indicated by (b) in FIG. 23, the second sub array column select circuit 21-2 includes a PMOS transistor 36a and NMOS transistors 36b and 36c as a circuit 21-22 for outputting the control signals CG2_0 to CG2_3.

The PMOS transistor 36a includes a gate electrode to which the control signal CSELB is input via a node N11, and a current path having one end to which the control signals FY_0 to FY_3 are input, and the other end connected to a node N12.

The NMOS transistor 36b includes a gate electrode to which the control signal CSELB is input via the node N11, and a current path having one end connected to the node N12, and the other end connected to the ground potential.

The NMOS transistor 36c includes a gate electrode to which the control signals FYB_0 to FYB_3 are input, and a current path having one end connected to the node N12, and the other end connected to the ground potential. The voltage of the node N12 is output as the control signals CG2_0 to CG2_3.

<Normal Word Line Driver Circuit>

The normal word line driver circuit 14-1a according to this embodiment will be explained below with reference to FIG. 24.

As shown in FIG. 24, the normal word line driver circuit 14-1a includes a PMOS transistor 37a and NMOS transistors 37b and 37c as a circuit for outputting a voltage to the local word lines LWL_0 to LWL_3.

The PMOS transistor 37a includes a gate electrode to which the control signal MWLB is input from the main word line via a node N13, and a current path having one end to which the control signals FX_0 to FX_3 are input, and the other end connected to a node N14.

The NMOS transistor 37b includes a gate electrode to which the control signal MWLB is input from the main word line via the node N13, and a current path having one end connected to the node N14, and the other end connected to the ground potential.

The NMOS transistor 37c includes a gate electrode to which the control signals FXB_0 to FXB_3 are input, and a current path having one end connected to the node N14, and the other end connected to the ground potential. The voltage of the node N14 is output to the local word lines LWL_0 to LWL_3.

<Redundancy Word Line Driver Circuit>

Next, the redundancy word line driver circuit 14-1b according to this embodiment will be explained with reference to FIG. 25.

As indicated by (a) in FIG. 25, the redundancy word line driver circuit 14-1b includes a PMOS transistor 38a and NMOS transistors 38b and 38c as a circuit 14-1b1 for outputting a voltage to the redundancy local word line SWL_0.

The PMOS transistor 38a includes a gate electrode to which the redundancy signal RDMWLB is input via a node N15, and a current path having one end to which the redundancy signal RD_0 is input, and the other end connected to a node N16.

The NMOS transistor 38b includes a gate electrode to which the redundancy signal RDMWLB is input from the main word line via the node N15, and a current path having one end connected to the node N16, and the other end connected to the ground potential.

The NMOS transistor 38c includes a gate electrode to which the redundancy signal RDB_0 is input, and a current path having one end connected to the node N16, and the other end connected to the ground potential. The voltage of the node N16 is output to the redundancy local word line SWL_0.

As indicated by (b) in FIG. 25, the redundancy word line driver circuit 14-1b includes a PMOS transistor 39a and NMOS transistors 39b and 39c as a circuit 14-1b2 for outputting a voltage to the redundancy local word line SWL_1.

The PMOS transistor 39a includes a gate electrode to which the redundancy signal RDMWLB is input via a node N17, and a current path having one end to which the redundancy signal RD_1 is input, and the other end connected to a node N18.

The NMOS transistor 39b includes a gate electrode to which the redundancy signal RDMWLB is input from the main word line via the node N17, and a current path having one end connected to the node N18, and the other end connected to the ground potential.

The NMOS transistor 39c includes a gate electrode to which the redundancy signal RDB_1 is input, and a current path having one end connected to the node N18, and the other end connected to the ground potential. The voltage of the node N18 is output to the redundancy local word line SWL_1.

<Normal Operation>

Figure 26:
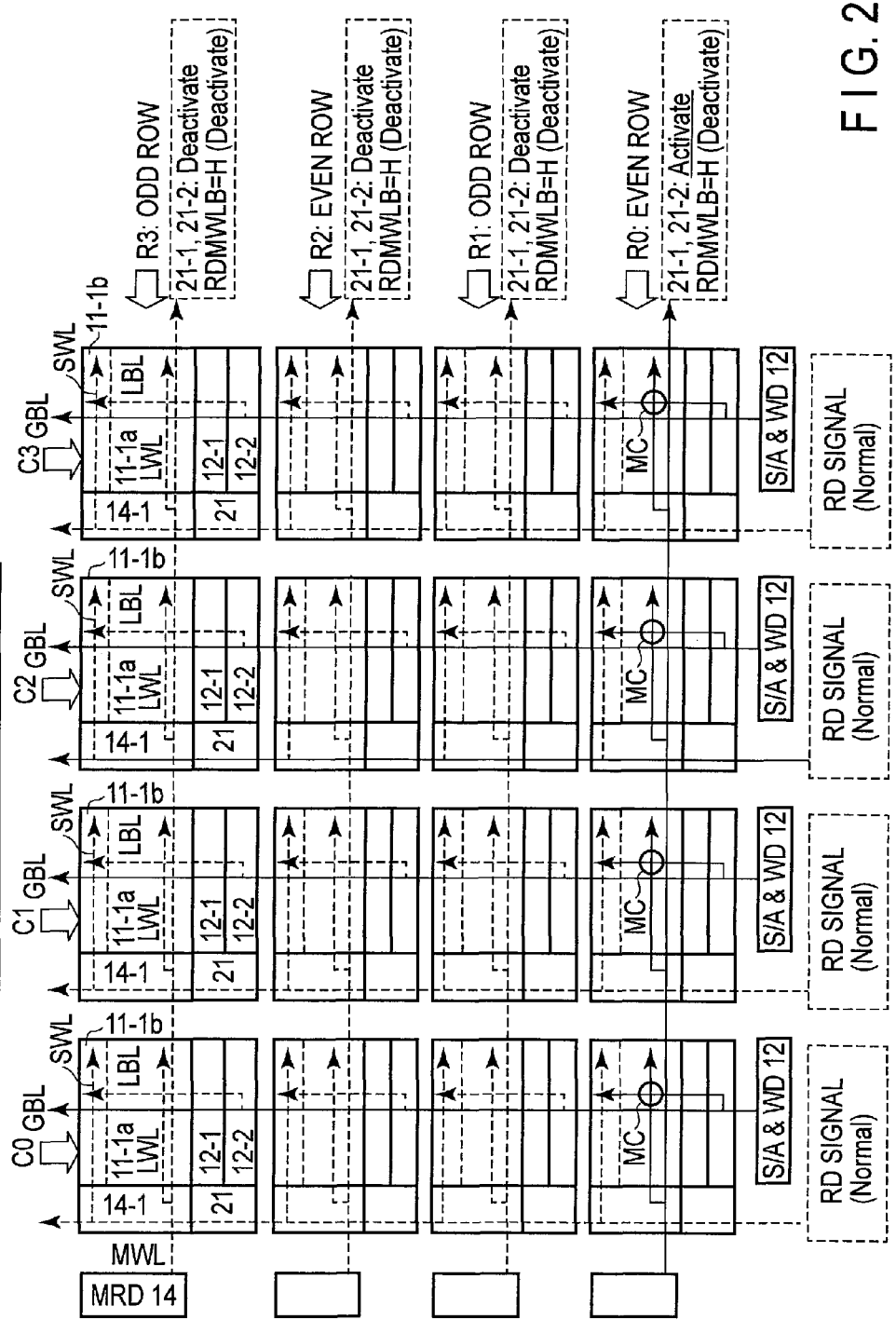
FIG. 26 is a block diagram showing a normal operation of the memory cell array according to the embodiment.

A normal read/write operation (to be also referred to as, e.g., a normal operation hereinafter for the sake of simplicity) of the semiconductor storage device 1 according to this embodiment will be explained below with reference to FIG. 26. Note that the "normal read/write operation" herein explained is an operation using no redundancy cell. Note also that in the following description, an operation in which the first sub array column select circuits 21-1 and 21-2 output "H" will be referred to as "activate" for the sake of simplicity. Furthermore, as to details of the operation of the first sub array column select circuit 21-1, see FIGS. 5 to 22 and the corresponding description.

In the normal operation, the sub arrays 11-1 are activated row by row. Assume that the normal operation is performed on four sub arrays (C0:R0, C1:R0, C2:R0, and C3:R0) 11-1. The four sub arrays (C0:R0, C1:R0, C2:R0, and C3:R0) 11-1 of the row "R0" are activated, a local word line LWL common to the sub arrays 11-1 is selected, a local bit line LBL is selected by the same address of the sub arrays 11-1, and the 1-bit memory cell MC is read from each sub array 11-1. In this operation, all the redundancy signals RDMWLB are deactivated ("H").

<Redundancy Operation 1>

Figure 27:
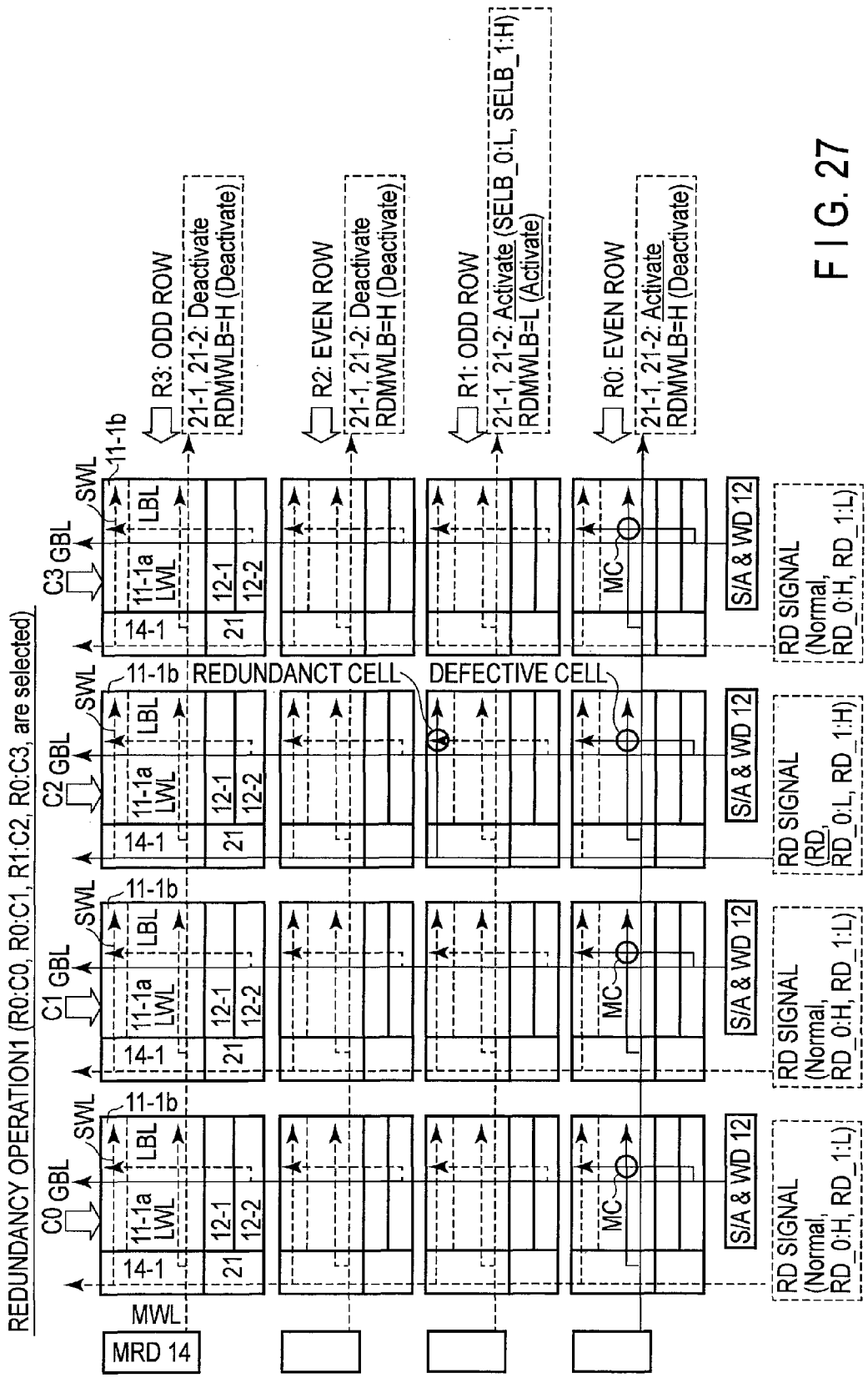
FIG. 27 is a block diagram showing a redundancy operation of the memory cell array according to the embodiment.

Practical example 1 of a redundancy cell read/write operation (to be also referred to as, e.g., a redundancy operation hereinafter for the sake of simplicity) of the semiconductor storage device 1 according to this embodiment will be explained below with reference to FIG. 27.

In the memory cell array 11 divided into sub arrays according to this embodiment, a defective memory cell sometimes exists on the local word line LWL of the normal cell array 11-1a of the sub array 11-1 belonging to an even row. In this case, the local word line LWL can be allocated to the redundancy cell area 11-1b of the sub array 11-1 in the same column as the sub array 11-1 described above and belonging to an odd row.

Also, in the memory cell array 11 divided into sub arrays according to this embodiment, a defective memory cell sometimes exists on the local word line LWL of the normal cell array 11-1a of the sub array 11-1 belonging to an odd row. In this case, the local word line LWL can be allocated to the redundancy cell area 11-1b of the sub array 11-1 in the same column as the sub array 11-1 described above and belonging to an even row.

In this example, if a defective memory exists in the normal cell array 11-1a of the sub array (C2:R0) 11-1, the local word line LWL on which the defective cell exists is disabled. Then, the local word line LWL is allocated to the local word line SWL of the redundancy cell area 11-1b of the sub array (C2:R1) 11-1 in the same column and belonging to another row.

To perform the redundancy operation on the sub array (C2:R1), the redundancy signals RD (RD_0=H and RD_1=L) of the column C2 are inverted (RD_0=L and RD_1=H). The redundancy signals RD of the columns C0, C1, and C3 are not inverted. Consequently, the sub array (C2:R0) is unselected. Then, the redundancy controller 13 activates the redundancy signal RDMWLB of the row R1 (RDMWLB=L). Also, control is so performed as to activate the sub array column select circuit 21-1 corresponding to the row R1.

By the operation as described above, the semiconductor storage device 1 according to this embodiment can perform the normal operation on the sub arrays (C0:R0, C1:R0, and C3:R0) 11-1, and can perform the redundancy operation on the sub array (C2:R1).

Since the redundancy signal is inverted, the sub array (C2:R0) 11-1 replaced with the sub array (C2:R1) 11-1 among normally selected sub arrays is unselected.

In this embodiment, the local word line LWL of the normal cell array 11-1a of a sub array belonging to an even row can be allocated to the local word line SWL of the redundancy area 11-1b of a sub array in the same column and belonging to an arbitrary odd row. Also, in this embodiment, the local word line LWL of the normal cell array 11-1a of a sub array belonging to an odd row can be allocated to the local word line SWL of the redundancy area 11-1b of a sub array in the same column and belonging to an arbitrary even row. In this case, when the control signal CG1_0 is selected in the normal cell array 11-1a, the control signal CG1_1 complementary to the control signal CG1_0 is selected in the redundancy area 11-1b belonging to a different row.

<Redundancy Operation 2>

Figure 28:
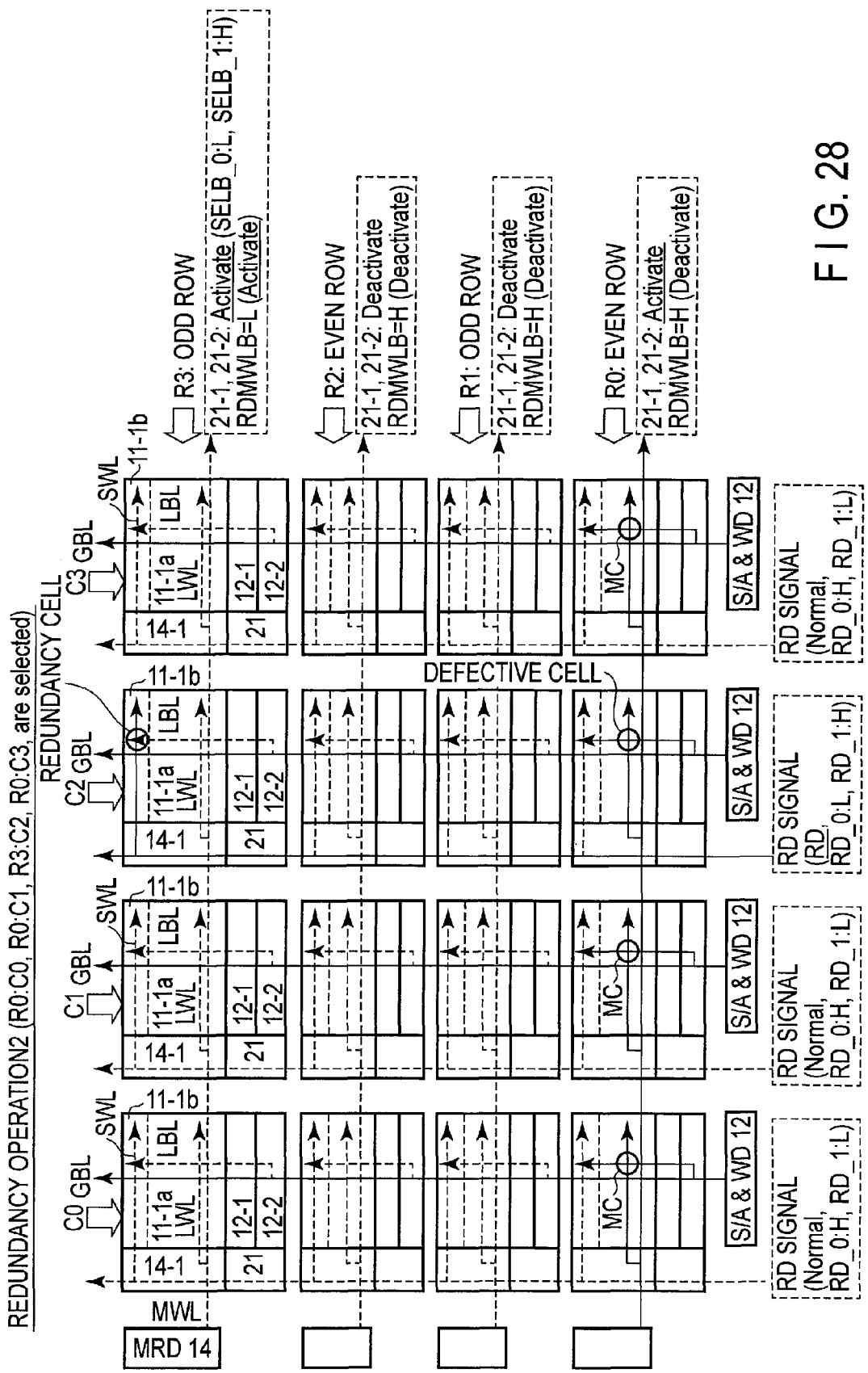
FIG. 28 is a block diagram showing a redundancy operation of the memory cell array according to the embodiment.

Next, practical example 2 of the redundancy operation of the semiconductor storage device 1 according to this embodiment will be explained with reference to FIG. 28. Note that the basic arrangement and basic operation of the semiconductor storage device 1 according to practical example 2 are the same as those of the semiconductor storage device 1 according to practical example 1 described above. Therefore, an explanation of items explained in above-described practical example 1 and items which can easily be known by referring to the above-descried practical example 1 will be omitted.

In practical example 2, if, for example, a defective memory exists on the local word line LWL of the normal cell array 11-1a of the sub array (C2:R0) 11-1, the local word line LWL is allocated to the redundancy cell area 11-1b of the sub array (C2:R3) 11-1. This operation will be explained below.

In this case, the normal operation is performed on the sub arrays (C0:R0, C1:R0, and C3:R0) 11-1, and the redundancy operation is performed on the sub array (C2:R3).

To perform the redundancy operation on the sub array (C2:R3), the redundancy signals RD (RD_0=H and RD_1=L) of the column C2 are inverted (RD_0=L and RD_1=H), and the redundancy signal RDMWLB of the row R3 is activated (RDMWLB=L). The redundancy signals RD of the columns C0, C1, and C3 are not inverted. Also, control is so performed as to activate the first sub array column select circuit 21-1 corresponding to the row R3.

Consequently, the sub array column select circuit 21-1 of the sub array (C2:R0) 11-1 of a cell to be replaced among normally selected sub arrays is unselected.

<Functions and Effects of Semiconductor Storage Device According to Embodiment>

If a defective cell exists on the local word line LWL of the normal cell array 11-1a of the sub array (C2:R0) 11-1 in a conventional semiconductor memory including a memory array divided into sub arrays, the local word line LWL on which the defective cell exists is replaced with the redundancy cell area 11-1b of the sub array 11-1. In this replacement, replacement is sometimes simultaneously performed even in the sub arrays (C0:R0, C1:R0, and C3:R0) 11-1 in which no defective cell exists on the local word line LWL, thereby replacing the same local word line LWL on which no defective cell exists (a comparative example).

In the above-described embodiment, however, only the local word line LWL of the normal cell array 11-1a of the sub array (C2:R0) 11-1 in which a defective memory cell exists can be replaced with the redundancy cell array 11-1b of the redundancy cell area 11-1b. Accordingly, the local word line LWL, on which no defective memory cell exists, of the normal cell array 11-1a of each of the sub arrays (C0:R0, C1:R0, and C3:R0) 11-1 is kept used without being replaced with the redundancy area 11-1b.

Also, in the first sub array column select circuit 21-1e corresponding to even rows and the first sub array column select circuit 21-1o corresponding to odd rows in the above-described embodiment, the input control signals SELB_0 and SELB_1 have a crossed relationship with the output signals CG1_0 and CG1_1.

In addition, the semiconductor storage device 1 according to this embodiment controls the redundancy signal for each column. More specifically, the redundancy signal RD for a column as a target of the redundancy operation is inverted from the redundancy signal RD to be supplied to a sub array as a target of the normal operation. Furthermore, when the redundancy signal RDWLB corresponding to a row as a target of the redundancy operation is selected, a redundancy word line belonging to another row on which no normal operation is performed is selected.

In this embodiment as described above, it is possible to perform the redundancy operation simultaneously with the normal operation by allocating a redundancy area for each sub array as needed. Also, the amount of circuits to be added to implement the above-described embodiment is very small. This makes it possible to provide a high-quality semiconductor storage device by increasing the defective memory cell repair efficiency while suppressing an increase in circuit area.

(Modification and Others)

Note that the defective cell repair method using only allocation to the redundancy area has been explained in the above-described embodiment, but the present invention is not limited to this. For example, when the sub array 11-1 has a size which can be repaired by ECC, it is possible to combine repair by ECC and repair using redundancy according to the above-described embodiment.

FIG. 29 shows the repair efficiencies of three repair methods, i.e., (i) a repair method using only redundancy of a comparative example, (ii) a repair method using redundancy and ECC of a comparative example, (iii) a repair method using redundancy of the above-described embodiment and ECC. As shown in FIG. 29, the repair method using redundancy of the above-described embodiment and ECC can repair a defective memory cell more efficiently.

Also, the redundancy controller 13 described above are arranged as "fuse sets" in the periphery of the memory cell array 11.

More specifically, as shown in, e.g., FIG. 30, PADs to be connected to an external apparatus are arranged in a central region of a substrate 100 so as to extend in the X direction, and fuse set are arranged to sandwich the PADs in the Y direction perpendicular to the X direction. In addition, memory cell arrays 11 are arranged to sandwich the fuse sets and PADs in the Y direction, and fuse sets are arranged such that each fuse set is adjacent to at least one side of each memory cell array 11 along the Y direction.

Also, as shown in FIG. 31, PADs are arranged at the end portions of a substrate 100 along the X direction, and memory cell arrays 11 and fuse sets are formed to be sandwiched between the PADs along the Y direction. The fuse sets are arranged such that each fuse set is adjacent to at least one side of each memory cell array 11 along the Y direction.

Thus, the method of arranging the redundancy controller 13 and redundancy controller 13 (fuse sets) described above can be changed as needed.

In addition, the above embodiment has been explained by taking an MRAM as an example of the storage device. However, the present invention can also be practiced as a resistance change memory having another hierarchical structure including the same elements as those disclosed in the above embodiment, e.g., a PCRAM (Phase Change Random Access Memory) or ReRAM (Resistive Random Access Memory).

Furthermore, in each embodiment described above, a bit line pair has been referred to as a bit line BL and source line SL for the sake of convenience. However, the present invention is not limited to this, and it is also possible to define a bit line pair as, e.g., a first bit line and second bit line.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first storage area including a plurality of memory cells each including a resistance change element which stores data;
a second storage area including a plurality of memory cells each including a resistance change element which stores data;
a sub memory cell array including the first storage area and the second storage area:
a memory cell array including a plurality of sub memory cell arrays arranged along a column direction and a row direction;
a third storage area which stores store redundancy information and to supply the redundancy information to the sub memory cell array; and
a control circuit which stores control an access operation to the memory cell array,
wherein when performing an access operation to the first storage area of at least one sub memory cell array belonging to a first row, and to at least one second storage area belonging to a second row,
the control circuit performs the access operation to the second storage area of a sub memory cell array belonging to a desired column and to the second row, based on the redundancy information of the third storage area.

2. The device according to claim 1, wherein
the plurality of memory cells are formed at intersections of a plurality of word lines running in a first direction, and a plurality of bit line pairs running in a second direction perpendicular to the first direction, and
the control circuit allocates a word line on which not less than a predetermined number of defective memory cells exist in the first storage area, to a word line in the second storage area, and
stores information about the allocating operation as the redundancy information in the third storage area.

3. The device according to claim 2, wherein the control circuit performs the allocating operation between sub memory cell arrays belonging to same column.

4. The device according to claim 1, wherein
the plurality of memory cells are formed at intersections of a plurality of word lines running in a first direction, and a plurality of bit line pairs running in a second direction perpendicular to the first direction,
the device further comprises:
a first select circuit which is formed for each sub memory cell array belonging to a 2nth (n: an integer not less than 0) row, and selects the bit line pair;
a second select circuit which is formed for each sub memory cell array belonging to a (2n+1)th row, and selects the bit line pair;
a third select circuit which is formed for each sub memory cell array, and selects a word line in the first storage area; and
a fourth select circuit which is formed for each sub memory cell array, and selects a word line in the second storage area,
when performing an access operation to the first storage area of a sub memory cell array belonging to the first row, and to the second storage area belonging to the second row and a first column,
the control circuit supplies the redundancy information to the first select circuit, the second select circuit, and the fourth select circuit formed in a sub memory cell array belonging to the first column, based on the redundancy information,
the first select circuit or the second select circuit having received the redundancy information sets the first storage area of a sub memory cell array belonging to the first row in an unselected state, and
the fourth select circuit having received the redundancy information selects the second storage area of a sub memory cell array belonging to the second row.

5. The device according to claim 4, wherein
a word line in the first storage area of a first sub memory cell array belonging to the 2nth row can be allocated to a word line in the second storage area of a second sub memory cell array belonging to same column as the column to which the first sub memory cell array belongs, and belonging to the (2n+1)th row,
a word line in the first storage area of a third sub memory cell array belonging to the (2n+1)th row can be allocated to a word line in the second storage area of a fourth sub memory cell array belonging to same column as the column to which the third sub memory cell array belongs, and belonging to the 2nth row, and
the redundancy information contains column information, row information, and word line information of the second storage area, and column information, row information, and word line information of the first storage area allocated to the second storage area.

6. The device according to claim 4, wherein
the third storage area supplies the redundancy information to the first select circuit or the second select circuit belonging to a column which accesses the second storage area, and
supplies a signal obtained by inverting the redundancy information to the first select circuit or the second select circuit belonging to a column which accesses the first storage area.

7. The device according to claim 4, wherein
the first select circuit comprises:
a first circuit which outputs a second select signal when receiving a first select signal; and
a second circuit which outputs a fourth select signal when receiving a third select signal, and
the second select circuit comprises:
a third circuit which outputs the fourth select signal when receiving the first select signal; and
a fourth circuit which outputs the second select signal when receiving the third select signal.

8. The device according to claim 7, wherein
the redundancy information includes a first redundancy signal and a second redundancy signal,
the first circuit receives the first redundancy signal, and generates the second select signal based on the first select signal and the first redundancy signal,
the second circuit receives the second redundancy signal, and generates the fourth select signal based on the third select signal and the second redundancy signal,
the third circuit receives the second redundancy signal, and generates the fourth select signal based on the first select signal and the second redundancy signal, and
the fourth circuit receives the first redundancy signal, and generates the second select signal based on the third select signal and the first redundancy signal.

9. The device according to claim 1, further comprising a bit line control circuit which performs control in the column direction of the memory cell array based on a signal from the control circuit.

10. The device according to claim 1, further comprising a word line control circuit which performs perform control in the row direction of the memory cell array based on a signal from the control circuit.

11. The device according to claim 10, wherein the word line control circuit supplies any select signal to a sub memory cell array as a target of the access operation.

12. The device according to claim 1, wherein the sub memory cell array is a unit repairable by ECC.

13. The device according to claim 1, wherein the third storage area is a nonvolatile storage area.

14. The device according to claim 1, wherein the third storage area is made of a metal or a semiconductor.

15. The device according to claim 1, wherein the second storage area is a redundancy area, and is an area accessible in accordance with the redundancy information.

16. The device according to claim 1, wherein the access operation is an operation of writing data to the memory cell, or an operation of reading data from the memory cell.

* * * * *